(12) United States Patent
Blankenship et al.

(10) Patent No.: US 12,038,796 B2
(45) Date of Patent: Jul. 16, 2024

(54) ADAPTIVE COOLING SYSTEMS AND METHODS, DOCKING STATIONS AND SYSTEMS USING THE SAME

(71) Applicant: Battelle Memorial Institute, Columbus, OH (US)

(72) Inventors: Joshua Blankenship, Centerburg, OH (US); James W. Walsh, Columbus, OH (US)

(73) Assignee: Battelle Memorial Institute, Columbus, OH (US)

( * ) Notice: Subject to any disclaimer, the term of this patent is extended or adjusted under 35 U.S.C. 154(b) by 57 days.

(21) Appl. No.: 17/680,699

(22) Filed: Feb. 25, 2022

(65) Prior Publication Data

US 2022/0269322 A1    Aug. 25, 2022

Related U.S. Application Data

(60) Provisional application No. 63/176,572, filed on Apr. 19, 2021, provisional application No. 63/153,478, filed on Feb. 25, 2021.

(51) Int. Cl.
| | |
|---|---|
| *G06F 1/20* | (2006.01) |
| *G06F 1/16* | (2006.01) |
| *G06F 1/18* | (2006.01) |
| *H05K 7/20* | (2006.01) |

(52) U.S. Cl.
CPC ............ *G06F 1/203* (2013.01); *G06F 1/1632* (2013.01); *G06F 1/188* (2013.01); *H05K 7/20209* (2013.01); *H05K 7/20909* (2013.01)

(58) Field of Classification Search
CPC ...... G06F 1/1616; G06F 1/1632; G06F 1/188; H05K 7/20209; H05K 7/20845; H05K 7/20863; H05K 7/2089; H05K 7/20909
See application file for complete search history.

(56) References Cited

U.S. PATENT DOCUMENTS

| | | | |
|---|---|---|---|
| 5,963,424 A * | 10/1999 | Hileman | G06F 1/206 361/679.48 |
| 6,664,751 B1 | 12/2003 | Gabriel et al. | |
| 8,619,426 B2 | 12/2013 | Chamseddine et al. | |

(Continued)

*Primary Examiner* — Eric S Ruppert
*Assistant Examiner* — Hans R Weiland
(74) *Attorney, Agent, or Firm* — Grossman, Tucker, Perreault & Pfleger PLLC; Donald J. Perreault

(57) ABSTRACT

Adaptive cooling system and methods, docking stations for electronic devices, and systems using the same are described. In embodiments the active cooling systems include a controller that compares a detected temperature of at least a component of a first electronic device to a first temperature threshold (T1D1) for the first electronic device. When the first temperature is ≥T1D1, the controller may issue a control signal that causes a cooling system for a second electronic device to operate at a defined duty level. In embodiments the adaptive cooling systems are incorporated into equipment for a vehicle, such as a vehicle center console. The docking stations may function as a battery eliminator and/or an uninterruptible power supply, and may include a mount, a power connector, and optionally a data connection, which may couple to corresponding device power and device data connections of an electronic device that is coupled to the mount.

19 Claims, 14 Drawing Sheets

(56) References Cited

U.S. PATENT DOCUMENTS

| | | | |
|---|---|---|---|
| 10,481,656 B2* | 11/2019 | Casparian | G06F 1/1632 |
| 2008/0295535 A1 | 12/2008 | Robinet et al. | |
| 2009/0008076 A1* | 1/2009 | Shariff | H05K 7/20581 |
| | | | 165/48.1 |
| 2012/0161596 A1* | 6/2012 | Manahan | H02B 1/28 |
| | | | 312/236 |
| 2018/0206365 A1* | 7/2018 | Norton | H05K 7/20727 |
| 2020/0018222 A1 | 1/2020 | Tholander et al. | |
| 2021/0185862 A1* | 6/2021 | Nagao | H05K 7/20863 |

* cited by examiner

ADAPTIVE COOLING SYSTEMS AND METHODS, DOCKING STATIONS AND SYSTEMS USING THE SAME

CROSS-REFERENCE TO RELATED APPLICATIONS

The present application claims the benefit of the filing date of U.S. Provisional Application Ser. No. 63/153,478, filed Feb. 25, 2021, and claims the benefit of the filing date of U.S. Provisional Application Ser. No. 63/176,572, filed Apr. 19, 2021, the entire teachings of which applications are hereby incorporated herein by reference.

STATEMENT REGARDING FEDERALLY SPONSORED RESEARCH OR DEVELOPMENT

This invention was made with government support under Contract No. H92222-16-D-0043-H9240320F0013 CON00031076 awarded by the Department of Defense. The government has certain rights in the invention.

TECHNICAL FIELD

The present disclosure relates to adaptive cooling systems and methods, docking stations, and systems using the same. In particular, the present disclosure relates to adaptive cooling systems and methods for cooling electronic equipment in a vehicle, docking stations for electronic equipment in vehicle, and vehicle equipment that includes such adaptive cooling systems and docking stations.

BACKGROUND

Electronic devices such as amplifiers and radios generate heat during operation. In the context of high power amplifiers and radios, the amount of heat generated can be significant.

Consequently, the temperature of such devices can rise quickly during operation. If the operating temperature of the device exceeds one or more thermal thresholds, many issues can arise such as reduction in output power, degraded device performance, or even damage to the device.

With the foregoing in mind, electronic devices such as amplifiers, radios, and the like are often housed in a relatively open enclosure to limit or prevent excessive heat buildup. Passive cooling systems (e.g., heat sinks) and active cooling systems (e.g., fans, air conditioning (AC), and the like) may also be utilized to remove or otherwise address heat generated by such devices during operation. Although effective, there is still a need for improved cooling systems for electronic devices, particularly when such devices are housed within a relatively small enclosure, such as a center console or other compartment of a vehicle. Likewise, there is a need for improved docking stations for electronic devices, such as amplifiers and radios, when such devices are housed in a small enclosure like a vehicle center console or other vehicle compartment. The present disclosure is directed towards such needs.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figure 1A:
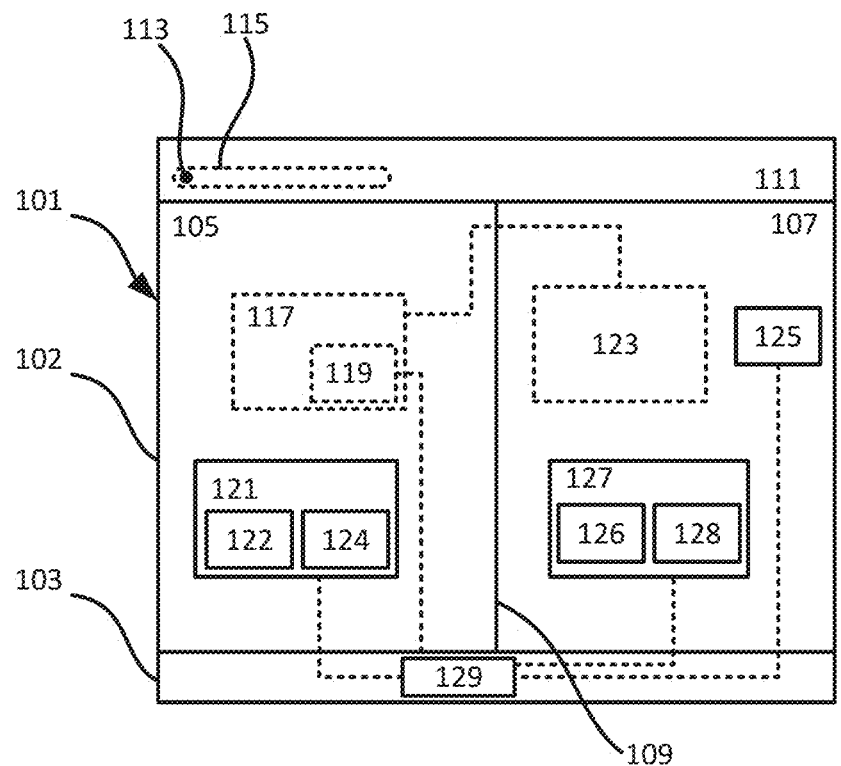
FIGS. 1A-1C are block diagrams of one example of one example of an adaptive cooling system consistent with the present disclosure, as it transitions from a closed state (FIG. 1A) to a partially open state (FIG. 1B) to an open state (FIG. 1C)

Although the following Detailed Description will proceed with reference being made to illustrative embodiments, many alternatives, modifications and variations thereof will be apparent to those skilled in the art.

DETAILED DESCRIPTION

Electronic devices such as amplifiers, radios, and the like, produce heat during operation. If such heat is not removed or otherwise addressed, the temperature of the device will increase over time—potentially affecting the performance of or even damaging components within the device if the temperature exceeds a thermal threshold. To address this issue passive cooling systems (e.g., heat sinks) and active cooling systems (e.g., fans, air conditioning, etc.) may be used to remove or counteract heat that is produced by an electronic device during operation. Although active and passive cooling systems are effective in many instances, thermal management of electronic devices remains a challenge in various use cases.

For example, in some contexts it may be desirable to house electronic devices that produce large amounts of heat within a relatively small, potentially covert enclosure. One such example is in the context of a news vehicle such as a media van. Such vehicles may include radios and amplifiers that are used to broadcast television and other signals at relatively high power. Such components are often expensive, and thus it may be desirable to conceal them from view within the vehicle in order to discourage theft. As such, it may be desirable to house radios and amplifiers within a news vehicle within a relatively small and covert enclosure such as a cabinet within the vehicle. If such components produce considerable heat, however, they may overheat when housed in that manner if they are not sufficiently cooled.

Similarly, military and law enforcement personnel often utilize non-standard commercial vehicles (NSCVs). NSCVs are typically designed to look like a traditional commercial vehicle in order to enable personnel to conduct operations in a covert manner, but often contain non-standard equipment. For example, an NSCV may be configured to house or carry one or a plurality of radios (such as man portable radios (Manpacks), handheld radios, handheld manpack and small form fit (HMS) leader systems, etc.), which may be used alone or in conjunction with one or more amplifiers. To maintain the covert nature of the NSCV, compartments for such non-standard equipment may be designed to appear as original equipment manufacturer (OEM) parts, such as but not limited to a glove box, center console, or under floor storage compartment. Consequently, equipment that can generate substantial heat may be housed within a relatively small compartment within the vehicle. This can present a challenging thermal management problem, particularly in the context of high power radios and amplifiers, as the temperature of such components can quickly exceed their designed thermal threshold if they are used in a small compartment without adequate cooling.

With the foregoing in mind, aspects of the present disclosure generally relate to adaptive cooling systems and methods, and systems that include and/or use the same. As will be described in detail below, in some embodiments systems of the present disclosure include a controller that includes a cooling control module (CCM). The controller may be configured to communicatively couple with at least a first temperature sensor, a second temperature sensor, an (optional) first electronic device cooling system for a first electronic device such as an amplifier, and a second electronic device cooling system for a second electronic device that is discrete (i.e., separate) from the first electronic device, such as a radio. The first temperature sensor may be an internal temperature sensor that is disposed within the first electronic device. The first temperature sensor may be configured to detect a first temperature of at least a component of the first electronic device and produce a first temperature signal that is indicative of the first temperature. The second temperature sensor may be an ambient temperature sensor that is configured to detect a second temperature of an environment in which the second electronic device is stored, and to produce a second temperature signal indicative of the second temperature.

The CCM may be configured, in response to receipt of the first temperature signal, to cause the controller to store or determine the first temperature and determine whether the first temperature exceeds a first temperature threshold (T1D1) for the first electronic device. When the first temperature is greater than or equal to T1D1, the CCM may cause the controller to issue a first control signal, wherein the first control signal is configured to cause the second electronic device cooling system (i.e., for the second electronic device) to operate at a first duty level. In embodiments the CCM may further cause the controller to determine whether the first temperature is greater than or equal to a second temperature threshold (T2D1) for the first electronic device, wherein the T2D1 is greater than or equal to T1D1. If so, the CCM may cause the controller to issue a second control signal, wherein the second control signal is configured to cause the second electronic device cooling system to operate at a second duty level, wherein the second duty level is higher than the first duty level. In that way, the adaptive control systems described herein may control the operation of a cooling system for a second electronic device (such as a radio), based at least in part on a detected temperature of at least a component of a first electronic device (such as an amplifier).

In embodiments the adaptive cooling systems described herein include or are in the form of an automobile component, such as but not limited to a vehicle console (e.g., a center console), a glove compartment, under floor storage, or the like. Without limitation, the adaptive cooling systems may be described herein in the form of a vehicle center console that includes a housing, a base, and a lid. The housing includes at least a first compartment and a second compartment that is at least partially discrete from the first compartment. The first compartment may be configured to house the first electronic device (e.g., an amplifier that includes the first temperature sensor), and the second compartment may be configured to house the second electronic device, the second temperature sensor, and the second electronic device cooling system. In such embodiments the controller may be located within the housing (e.g., within the first compartment, the second compartment or a combination thereof), within a cavity within the base, within the lid, or external to the automobile component (e.g., the center console). Without limitation, the controller is preferably housed within the automobile component, such as within the base of a center console. In such instances, the controller may be communicatively coupled with the first temperature sensor, second temperature sensor, optional first electronic device cooling system, and the second electronic device cooling system as noted above, and may function to control operation of the second electronic device cooling system based on a first temperature of the first electronic device as discussed previously.

Other aspects of the present disclosure relate to docking stations for electronic equipment, such as but not limited to man portable radios (Manpacks), handheld radios, handheld manpack and small form fit (HMS) leader systems, amplifiers, combinations thereof, and the like. In some embodiments, the docking stations described herein can provide a power connection to a source of external power (i.e., to a power source outside of the electronic device), and a data connection for the transfer of data to and/or from the electronic device. The docking stations described herein may also be sized and configured to enable storage of an electronic device such as a Manpack, HMS system, and/or handheld radio in a relatively small compartment while the electronic device is mounted to the docking station. In particular, the docking stations described herein may be configured to enable discrete storage of an electronic device in a vehicle compartment such as an automobile center console while the electronic device is mounted to the docking station.

Figure 1B:
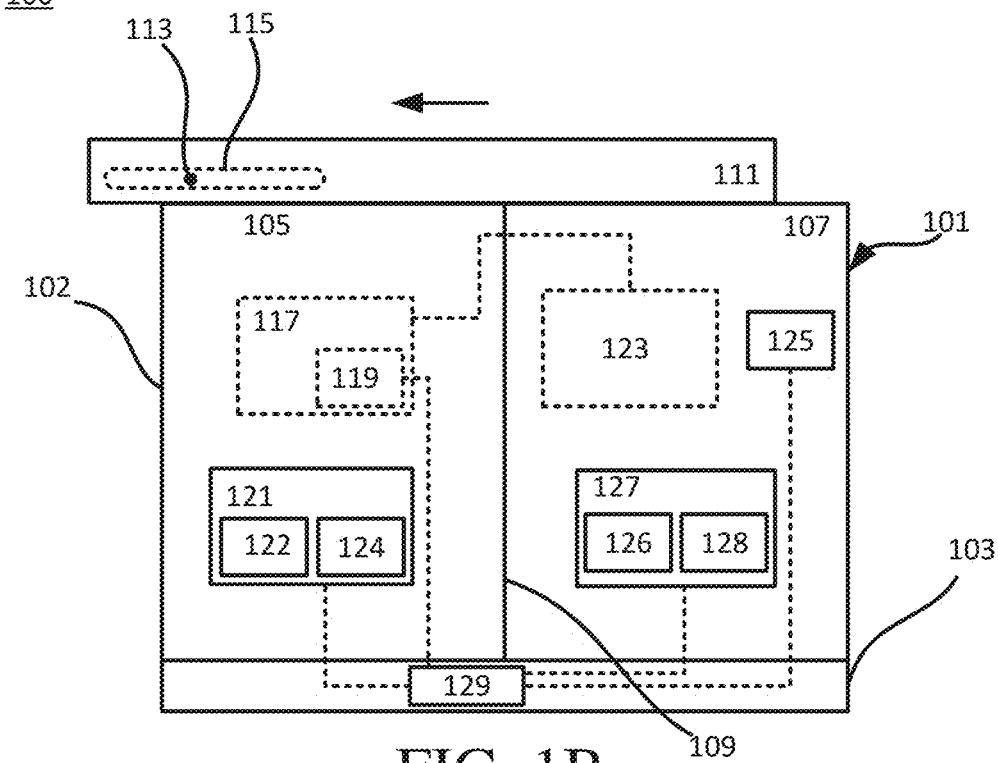
Figure 1C:
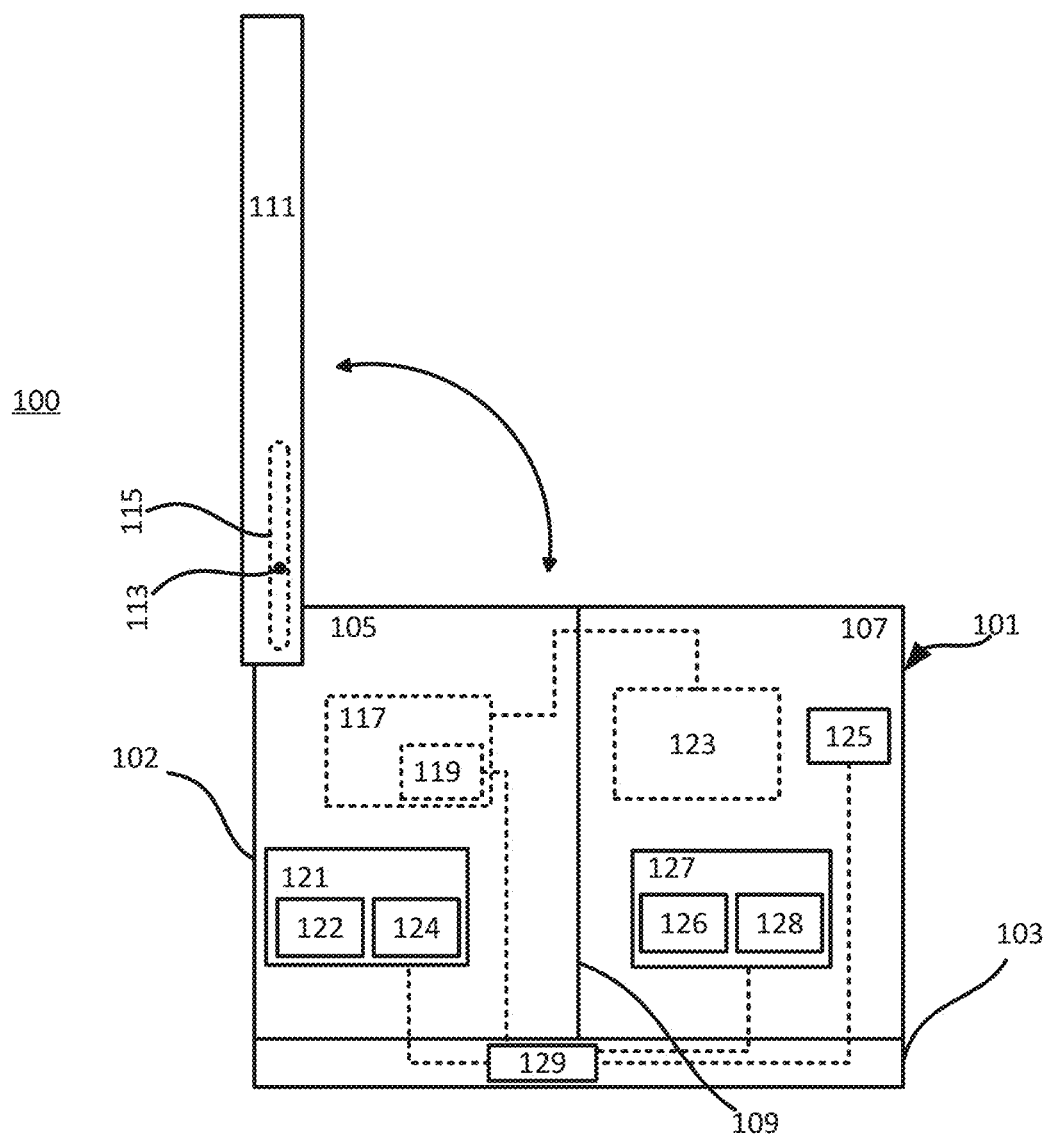

FIGS. 1A-1C are block diagrams of one example of an adaptive cooling system consistent with the present disclosure. As shown, system 100 includes a housing 101 with a base 103 at least one wall 102 defining an interior and an exterior of the housing and a lid 111. The housing includes at least a first compartment 105 in an interior of the housing and a second compartment 107 in an interior of the housing. The first compartment 105 and second compartment 107 are configured such that they are at least partially discrete from one another. In this context, "at least partially discrete"

means that the first and second compartments 105, 107 are at least partially separated from one another, e.g., by an internal wall or another structure of housing 101. In the embodiment of FIGS. 1A-1C, system 100 (or more particularly, housing 101) includes a divider 109 that at least partially separates first and second compartments 105, 107. While divider 109 is depicted as forming part of a common wall between first and second compartments 105, 107, such a configuration is not required and system 100 may be configured differently.

For the sake of example and ease of understanding housing 101 is depicted as including two compartments, i.e., first and second compartments 105, 107. Housing 101 is not limited to that configuration, however, and may include any suitable number of compartments. For example, housing 101 may include any suitable number of compartments, such as 2, 3, 4, 5, 6 or more compartments. When greater than two compartments are present in housing 101, each such compartment may be at least partially discrete from each other compartment within housing 101. In embodiments, housing 101 includes 3, 4, or more compartments, wherein at least one divider separates each compartment from at least one adjacent compartment. In such instances, each divider may form at least part of a common wall between two or more compartments.

As further shown, system 100 includes a lid 111 that is movable between a closed state and an open state. This concept is shown in FIGS. 1A-1C, which depict lid 111 in a closed state (FIG. 1A) wherein the lid 111 blocks access to the first 105 and second 107 compartments from a location external to the housing 101, a partially open state (FIG. 1B), and an open state (FIG. 1C) wherein access to the first 105 and second 107 compartments from a location external to the housing 101 is not blocked by the lid. In the closed state the lid may conceal the contents of housing 101 from view, and the external surfaces of housing 101, base 103, and lid 111 may be configured to provide the appearance of an OEM part for a vehicle, such as but not limited to an OEM part of an automobile, an aircraft, a boat, or the like. In embodiments, the external surfaces of housing 101, base 103, and lid 111 are configured such that system 100 is in the form of a center console of an automobile, underfloor storage of an automobile, or a glove compartment of an automobile. Without limitation, housing 101, base 103, and lid 111 are configured such that system 100 is in the form of a center console of an automobile.

Lid 111 and housing 101 may be coupled to one another in any suitable manner that allows lid 111 to be removed or to transition between an open and a closed state. With that in mind, FIGS. 1A-1C illustrate an embodiment in which system 100 includes pins 113 that are provided on opposing sides of housing 101, and which are configured to support lid 111 within an optional track 115. In such embodiments, system 100 can be transitioned from the closed state in FIG. 1A to a partially open state in FIG. 1B by sliding lid 111 in a lateral direction relative to an opening in the housing 101. The lateral movement of lid 111 causes the track 115 to slide along pins 113, as shown in FIG. 1B. System 100 may then be transitioned to the open position in FIG. 1C by rotating lid 111 about pins 113, as shown in FIG. 1C. Lid 111 may be retained in the position shown in FIG. 1C, or it may be further moved to a retracted position in by sliding track 115 vertically along pins 113, such that lid 111 is nested or otherwise disposed against the wall 102 of housing 101. To facilitate such movement, optional track 115 may have a length that is less than or equal to a height of a wall 102 of housing 101. Of course, system 100 (and particularly housing 101 and lid 111) are not limited to the illustrated configuration and may be configured in any suitable manner. For example, in embodiments system 100 may be configured such that lid 111 is removable from housing 101. Alternatively or additionally, lid 111 may be coupled to housing 101 via a hinge.

In any case, the compartments within housing 101 may be configured to house one or more electronic devices therein. For example and as shown in FIGS. 1A-1C, first compartment 105 may be configured to house a first electronic device 117, and second compartment 107 may be configured to house a second electronic device 123. As first and second electronic devices 117 and 123 are removable from housing 101, they are illustrated in hashed lines to depict their optional nature in system 100. For the sake of illustration and ease of understanding the present disclosure may refer to embodiments in which the first electronic device 117 is or includes an amplifier with an integral first temperature sensor 119, and the second electronic device 123 is or includes a radio (e.g., handheld radio, Manpack radio, HMS systems, combinations thereof, and the like) that is configured to operate independently or in conjunction with the amplifier and which does not include an integral temperature sensor. Of course, first and second electronic devices 117, 119 are not limited to amplifiers and radios, and any suitable electronic devices may be used. Non-limiting examples of suitable electronic devices that may be used as first electronic device 117 and second electronic device 123 include communications devices (e.g., amplifiers, radios, HMS systems, cellular phones, smart phones, and the like), computing devices (e.g. laptops, table personal computers, a vehicle integrated computing system), electronic storage and/or charging devices (e.g., batteries), combinations thereof, and the like, which may be used alone or in conjunction with one another.

In embodiments, the first electronic device 117 is configured to facilitate operation of or otherwise work in conjunction with the second electronic device 123. For example, in embodiments the second electronic device 123 is a radio that is configured to generate a communications signal, and first electronic device 117 is an amplifier that is electrically coupled to the radio for amplifying the power of the communications signal from the radio, e.g., to facilitate long range transmission. In other embodiments second electronic device 123 may be computing equipment and first electronic device 117 may be an electronic storage/charging device (e.g., a battery) that is electrically coupled to the computing equipment to provide power to the computing equipment, and/or to charge an internal battery of the computing equipment.

System 100 may include a first temperature sensor 119 and a second temperature sensor 125. The first temperature sensor 119 is configured to detect a first temperature of at least a component of the first electronic device 117, and to produce a first temperature sensor signal that is indicative of the first temperature. First temperature sensor 119 may be any suitable type of temperature sensor that is capable of detecting a temperature of at least a component of first electronic device 117. In embodiments, first temperature sensor 119 is in the form of or includes a temperature sensor that is integral with first electronic device 117. That is, first temperature sensor 119 may be in the form of or include an integral temperature sensor. In that context, an "integral temperature sensor" means a temperature sensor that forms a part of an electronic device (e.g., a part of first electronic device 117) or is disposed within a housing of an electronic device (e.g., within a housing of first electronic device). In embodiments where first temperature sensor 119 is an integral temperature sensor of first electronic device, it may be removed from housing 101 when first electronic device 117 is removed from first compartment 105. Hence, first temperature sensor 119 is shown in hashed lines to depict its optional nature in system 100. When first temperature sensor 119 is an integral temperature sensor, the systems described herein may be understood to include components (e.g., a controller 129) that are configured to communicatively couple with the first temperature sensor 119, e.g., when first electronic device 117 is present within first compartment 105.

Second temperature sensor 125 is generally configured to detect a second temperature and to produce a second temperature sensor signal indicative of the detected second temperature. Without limitation, in embodiments the second temperature sensor is preferably an ambient temperature sensor and the second temperature is an ambient temperature of second compartment 107. In such instances, the second temperature sensor signal is indicative of a detected ambient temperature within second compartment 107. Such a sensor may be useful, for example, when second electronic device 123 is a device that does not include an integral temperature sensor. Of course, such a configuration is not required, and second temperature sensor may be configured differently. For example, second temperature sensor 125 may be a temperature sensor that is integral with second electronic device 123, in which case it may be configured to measure a temperature of at least a part of second electronic device 123 instead of the ambient temperature of second compartment 107.

Any suitable type of temperature sensor may be used as first temperature sensor 119 and second temperature sensor 125. Non-limiting examples of suitable temperature sensors that may be used a first temperature sensor 119 and second temperature sensor 125 include thermocouples, resistance temperature detectors, semiconductor based integrated circuits, thermistors, combinations thereof, and the like. Without limitation, first temperature sensor 119 is an integrated circuit temperature sensor and second temperature sensor 125 is a thermocouple.

System 100 may also include a first electronic device cooling system 121 and a second electronic device cooling system 127. In general, first electronic device cooling system 121 is configured to provide active and/or passive cooling to the first compartment 105 or, more particularly, to first electronic device 117 when it is within first compartment 105. In embodiments, first electronic device cooling system 121 includes at least one first electronic device active cooling device such as a fan, a thermoelectric (Peltier) cooler, a liquid cooling loop, combinations thereof, and the like. Without limitation, in embodiments includes at least one first fan. In any case, the first electronic device cooling system preferably includes a fan or other active cooling device that has a first variable duty level (e.g., fan speed) that may be set, e.g., in response to a control signal, e.g., via pulse width modulation or another control scheme.

The first fan may be coupled, e.g., mechanically and fluidly coupled, to a first compartment inlet 122 and a first compartment outlet 124. In such instances the first fan may be configured to draw relatively cool inlet air (i.e., a first compartment inlet air stream) into first compartment 105 via the first compartment inlet 122 that is coupled, e.g., mechanically and fluidly coupled, to the first compartment 105. In some embodiments, the first compartment inlet 122 is directly coupled to the first compartment 105. The first compartment inlet air stream may be directed by the first fan (directly or via ducting) such that it is incident on first electronic device 117 when first electronic device 117 is within first compartment 105. In that regard, first compartment 105 may include a first stand or mount, wherein the first stand or mount is configured to receive and position first electronic device 117 such that relatively cool first compartment inlet air stream is directed onto the first electronic device 117, e.g., in an optimized fashion. In any case, the first compartment inlet air stream may acquire heat from first electronic device 117. The resulting relatively warm outlet air stream (i.e., first compartment outlet air stream) may then flow out of the first compartment outlet 124 and into an environment surrounding system 100. For example, when system 100 is in the form of or includes a vehicle component such as a vehicle center console, the first compartment inlet air stream may be drawn from the cabin inside the vehicle, and the first compartment outlet air stream may be dispensed into the cabin of the vehicle.

For the sake of example and ease of understanding first electronic device cooling system 121 is illustrated as separate from first electronic device 117 and is described above as including an active cooling device such as a fan. First electronic device cooling system 121 and system 100 are not limited to such a configuration and may be configured differently. For example, first electronic device cooling system may be configured to include or be in the form of a (first) passive cooling component such as a heat exchanger (e.g., a heat sink). In such instances, all or a portion of first electronic device cooling system 121 may be coupled to or integral with first electronic device 117, and one or more of first compartment inlet 122 and first compartment outlet 124 may be omitted as would be understood by those of skill in the art.

Second electronic device cooling system 127 is generally configured to provide active cooling for electronic devices within second compartment 107, and in particular second electronic device 123. In that regard, second electronic device cooling system may include one or more second electronic device active cooling devices, such as but not limited to one or more fans, a thermoelectric (Peltier) cooler, a liquid cooling loop, combinations thereof and the like. The second electronic device cooling system 127 may also optionally include one or more (second) passive cooling devices such as heat sinks, radiators, etc., which may be used in conjunction with the second electronic device active cooling device(s). Without limitation, the second electronic device cooling system 127 preferably includes at least one fan. In any case, the second electronic device cooling system 127 preferably includes a fan or other active cooling device that has a second variable duty level (e.g., fan speed) that may be set, e.g., in response to a control signal, e.g., via pulse width modulation or another control scheme.

In embodiments the second electronic device cooling system 127 includes a second fan, a second compartment inlet 126 and a second compartment outlet 128. The fan is coupled, e.g., mechanically and fluidly coupled, to the second compartment inlet 126 and the second compartment inlet 126 is coupled, e.g., mechanically and fluidly coupled to the second compartment 107. In some embodiments, the second compartment inlet 126 is directly coupled to the second compartment 107. The second electronic device cooling system 127 is configured to draw relatively cool inlet air (i.e., a second compartment inlet air stream) into second compartment 107 via the second compartment inlet 126. The second compartment inlet air stream may be directed by the second fan (directly or via ducting) such that it is incident on a second electronic device 123 when second electronic device 123 is within second compartment 107. In that regard, second compartment 107 may include a second stand or mount, wherein the second stand or mount is configured to receive and position second electronic device 123 such that relatively cool second compartment inlet air stream is directed onto the second electronic device 123 when the fan of second electronic device cooling system 127 is in operation. In any case, the second compartment inlet air stream may acquire heat from the second electronic device 123. The resulting relatively warm outlet air stream (i.e., second compartment outlet air stream) may then flow out of the second compartment outlet 128 and into an environment surrounding system 100. For example, when system 100 is in the form of or includes a vehicle component such as a vehicle center console, the second compartment inlet air stream may be drawn from the cabin inside the vehicle, and the second compartment outlet air stream may be dispensed into the cabin of the vehicle.

As will be described later in conjunction with FIGS. 4A-4C, the first and second compartment inlets 122, 126 and first and second compartment outlets 124, 128 may be positioned to facilitate the cooling of electronic devices within first and second compartments 105, 107. For example, system 100 may be configured such that the first and second compartment inlets 122, 126 are positioned to limit or prevent the intake of the relatively warm outlet air streams that are exhausted from first and second compartment outlets 124, 128. That is, first and second compartment inlets 122, 126 may be oriented and/or positioned away from first and second compartment outlets 124, 128, so as to limit or prevent the incorporation of the relatively warm outlet air stream(s) in the inlet air stream(s) provided to first compartment 105 and/or second compartment 107. In embodiments, housing 101 includes a bottom and one or a plurality of walls 102. In such instances, the first compartment inlet 122 may include an opening formed through the bottom of housing 101, and the first compartment outlet 124 may include an opening formed through a side or the rear or of housing 101. In such instances the first compartment inlet air stream may be drawn through the opening in the bottom of the housing 101, and the first compartment outlet air stream may be exhausted through the opening in the side or rear of the housing 101. In such embodiments the second compartment inlet 126 may include an opening through the bottom or front of the housing 101, and the second compartment outlet is formed through a side of the housing 101. In embodiments the housing 101 may include a first side and a second side substantially opposite the first side, wherein the opening for the first compartment outlet 124 is formed through the first side or the rear of housing 101, and the opening for the second compartment outlet 128 is formed through the second side of the housing 101. In that way, the outlet air streams are directed into the environment surrounding system 100 and away from one or both of first compartment inlet 122 and second compartment inlet 126.

System 100 further includes a controller 129. For the sake of illustration controller 129 is shown as being positioned or within (e.g., within a cavity of) base 103, but it should be understood that controller 129 may be positioned differently. For example, controller 129 may be located within housing 101 (e.g., within first compartment 105, within second compartment 107, within another compartment, etc.), on or within lid 111, or on an exterior surface of system 100. Still further, controller 129 may located outside of housing 101, base 103, and lid 111.

In any case, controller 129 is configured to communicatively couple with the first temperature sensor 119 (when present), the second temperature sensor 125, optionally the first electronic device cooling system 121, and the second electronic device cooling system 127. The manner in which controller 129 is communicatively coupled to such components is not limited, and controller 129 may be communicatively coupled to such components in any suitable manner. For example, controller 129 may be configured to communicatively couple with any or all of such components via a wired or wireless connection using one or more currently known or future developed wired or wireless communication standards.

Controller 129 is generally configured to control the operation of the second electronic device cooling system based at least in part temperatures detected by the first temperature sensor 119 and/or the second temperature sensor 125. Without limitation, controller 129 is preferably configured to control operation of the second electronic device cooling system (i.e., the cooling system for electronic devices within second compartment 107) based at least in part on the temperature detected by first temperature sensor 119.

Figure 2:
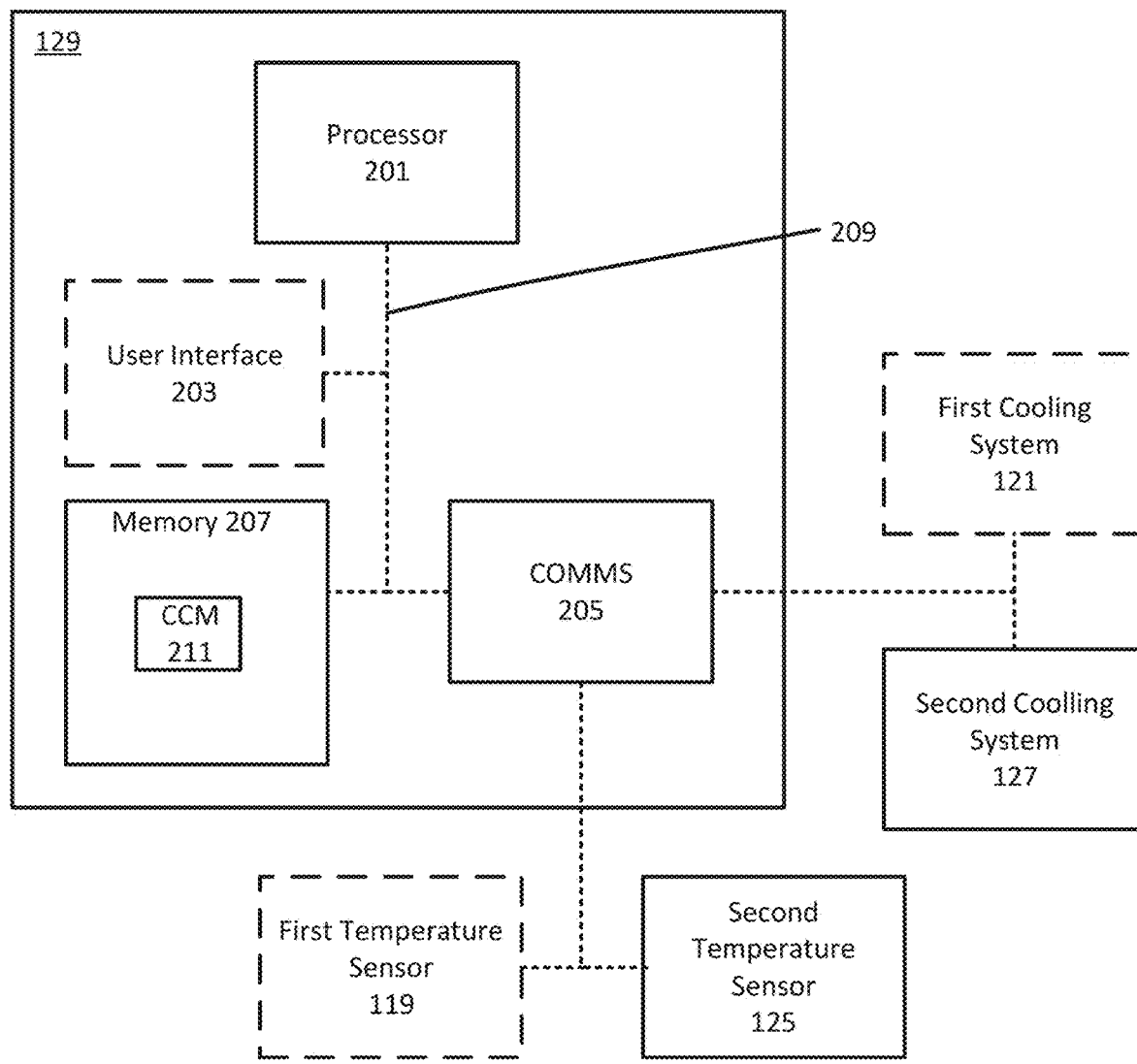
FIG. 2 is a block diagram of one example of an adaptive cooling controller consistent with the present disclosure.

Reference is now made to FIG. 2, which is a block diagram illustrating one example of a controller 129 that may be used in accordance with the present disclosure. As shown, controller 129 includes a processer 201, an optional user interface 203, communications (COMMS) circuitry 205 and memory 207. Such components may be communicatively coupled to one another via a bus 209.

Processor 201 may be any suitable general-purpose processor or application specific integrated circuit. Without limitation, in embodiments processor 201 is one or more single or multicore processors produced by INTEL® corporation, APPLE® corporation, AMD® corporation, SAMSUNG® corporation, NVIDIA® corporation, Advanced RISC (Reduced Instruction Set Computer)$_{[JB1]}$ Machines (ARM®) corporation, combinations thereof, or the like. Alternatively, processor 201 may be or include a microcontroller, such as a field programmable gate array. While FIG. 2 depicts the use of a single processor 201, it should be understood that: a single processor using a single core, a single processorusing a single thread, a single processor using multiple cores, a single processor using multiple threads, multiple processors using a single core, multiple processors using a single thread, multiple processors using multiple cores, and multiple processors using multiple threads can be used. $_{[JB2]}$ Optional user interface 203, when used, is configured to provide a mechanism for a user to interact with and configure controller 129 and/or one or more components thereof. Any suitable user interface may be used as user interface 203. For example, user interface 203 may be or include a mechanical user interface, a graphical user interface, or a combination thereof.

COMMS 205 may include hardware (i.e., circuitry), software, or a combination of hardware and software that is configured to allow controller 129 to transmit and receive messages via wired and/or wireless communication to/from one or more devices, such as but not limited to first temperature sensor 119, second temperature sensor 125, first electronic device cooling system 121, and second electronic device cooling system 127. Communication between COMMS 205, first temperature sensor 119, second temperature sensor 125, first electronic device cooling system 121, and second electronic device cooling system 127 may occur, for example, via a wired or wireless connection using one or more currently known or future developed communication standards. COMMS 205 may include hardware to support such communication, e.g., one or more transponders, antennas, BLUETOOTH™ chips, personal area network chips, near field communication chips, wired and/or wireless network interface circuitry, combinations thereof, and the like. In embodiments first temperature sensor 119 is an integral temperature sensor of first electronic device 117. In controller 129 may be configured to establish (via COMMS 205) a wired or wireless communications link when first electronic device 117 is within first compartment. Controller 129 may also establish (via COMMS 205) a wired or wireless communications link with second temperature sensor 125, and first and second electronic device cooling systems 121, 127 in a similar manner.

Memory 207 may be any suitable type of computer readable memory. Examples of memory types that may be used as memory 207 include but are not limited to: programmable memory, non-volatile memory, read only memory, electronically programmable memory, random access memory, flash memory (which may include, for example NAND or NOR type memory structures), magnetic disk memory, optical disk memory, phase change memory, memristor memory technology, spin torque transfer memory, combinations thereof, and the like. Additionally or alternatively, memory 207 may include other and/or later-developed types of computer-readable memory.

Controller 129 further includes cooling control module (CCM) 211. In this specific context, the term "module" refers to software, firmware, circuitry, and/or combinations thereof that is/are configured to perform one or more operations consistent with the present disclosure. Software may be embodied as a software package, code, instructions, instruction sets and/or data recorded on non-transitory computer readable storage mediums. Firmware may be embodied as code, instructions or instruction sets and/or data that are hard-coded (e.g., nonvolatile) in controller 129, e.g., within memory 207 (as shown in FIG. 2) or other computer readable storage. In embodiments, CCM 211 is in the form of logic that is implemented at least in part in hardware to perform cooling control operations consistent with the present disclosure. For example, CCM 211 may be in the form of computer readable instructions which when executed by processor 201 cause controller 129 to perform adaptive cooling operations consistent with the present disclosure, such as but not limited to the operations of the adaptive cooling methods described herein.

For example, in embodiments first temperature sensor 119 may be an integral temperature sensor of a first electronic device (e.g., an amplifier) 117 within first compartment 105, and second temperature sensor 125 may be an ambient temperature sensor within second compartment 107. The first temperature sensor 119 may be configured to detect a first temperature of at least a component of the first electronic device and produce a first temperature sensor signal indicative of the first temperature. The second temperature sensor 125 may be configured to detect the ambient (i.e., second) temperature of second compartment 107, and to produce a second temperature sensor signal indicative of the second temperature. For convenience, the first temperature signal is also referred to herein as an integral temperature signal or "ITS", and the second temperature signal is also referred to herein as an ambient temperature signal or "ATS." In such embodiments controller 129 (or more specifically, COMMS 205) may be configured to receive one or both of the first and second temperature sensor signals via wired or wireless communication. As may be appreciated, when first temperature sensor 119 is integral with first electronic device 117, a first temperature sensor signal may not be produced or received when first electronic device 117 is not within first compartment 105.

CCM 211 may be configured to cause controller 129 to monitor for the reception of the first and/or second temperature signals from the first and/or second temperature sensors 119, 125. For the sake of clarity, the present disclosure will first describe operations of controller 129 when a first (ITS) temperature sensor signal is received. A description will then be provided of operations of controller 129 when a first (ITS) temperature sensor signal is not received.

When a first (ITS) temperature sensor signal is received, the CCM 211 may cause the controller 129 to store the first temperature signal as a signal representative of the first temperature, or the or the CCM 211 may cause controller 129 to determine the first temperature of the first electronic device 117 based at least in part on the first temperature sensor signal to provide a signal representative of the first temperature. As used herein the word "determine" when used to describe the first temperature or the second temperature means that the controller generates signal or value, e.g., an analog signal or digital value, representative of the first temperature or the second temperature that can be compared to a temperature threshold. Likewise, CCM 211 may optionally cause controller 129 to store the second temperature signal or determine the second temperature (i.e., the ambient temperature of second compartment 107) based at least in part on the second (ATS) sensor signal. CCM 211 may then cause controller to determine whether the first temperature and/or the second temperature exceeds one or more threshold operating temperatures.

When a first (ITS) signal is received, CCM 211 may cause controller 129 to compare the signal representative of the first temperature to a first temperature threshold for the first electronic device 117, which is referred to herein as T1D1 for convenience. That is, controller 129 may compare a signal representative of the detected temperature of at least a component of the first electronic device 117 to a first threshold temperature of the first electronic device 117. CCM 211 may also optionally cause controller 129 to compare the signal representative of the second temperature to a first temperature threshold for the second electronic device 123 within second compartment 107, which is referred to herein as T1D2 for convenience. That is, controller 129 may optionally compare a signal representative of the detected ambient temperature of the second compartment to a first temperature threshold of the second electronic device 123. For simplicity and ease of explanation, the controller 129 may be described as comparing a temperature to a threshold. As will be understood by those of ordinary skill in the art, references to a controller comparing a temperature to a threshold means the controller 129 compares as signal representative of the temperature to a signal representative of the threshold.

T1D1 and T1D2 may be each set to a temperature or a temperature range at which cooling of the second electronic device 123 is to be initiated. For example, T1D1 may be set to a temperature or temperature range of the first electronic device 117 in first compartment 105 that is expected to cause the temperature of the second electronic device 123 in second compartment 107 to increase to a value in which cooling is desired. Similarly, T1D2 may be set to a temperature or temperature range of second compartment 107 at which cooling is desired. T1D1 and T1D2 may be the same or different, and in some embodiments are the same. For example, in embodiments T1D1 and T1D2 are both set to a first temperature or temperature range, such as between about 30° C. to about 45° C., such as about 40° C. to about 45° C. Without limitation, T1D1 and T1D2 are both about 45° C.

If the controller determines that the first temperature is less than T1D1 and the second temperature is less than T1D2, then active cooling components within second electronic device cooling system 127 may remain off. When controller 129 determines that the first temperature is ≥T1D1 or the second temperature is ≥T1D2, however, CCM 211 may cause controller 129 to issue a first control signal. In general, the first control signal is configured to cause active cooling components (e.g., one or more fans) within the second electronic device cooling system 127 to operate at a first duty level. For example, when second electronic device cooling system 127 includes a fan, the first control signal may cause the fan to turn on at a first duty level when the first temperature is ≥T1D1 or the second temperature is ≥T1D2. Controller 129 may set the first duty level, e.g., using pulse width modulation or another technique that provides control over the speed of the fan(s) within second electronic device cooling system 127. At this time, CCM 211 may optionally cause controller 129 to issue a first supplemental control signal that is configured to cause active cooling components within first electronic device cooling system 121 to turn on, e.g., at a first duty level. For example, controller 129 may cause active cooling components within first electronic device cooling system 121 to operate at a first duty level in response to a determination that the first temperature is ≥T1D1 and/or another temperature threshold for first electronic device 117.

CCM 211 may then cause controller 129 to continue to monitor the ITS and ATS signals from the first and second temperature sensors; store or determine the first and second temperatures respectively based at least in part on such as signals, respectively; and compare the first and second temperatures to corresponding additional temperature thresholds. For example, CCM 211 may cause controller 129 to compare the first temperature to a second temperature threshold (T2D1) for the first electronic device 117, wherein T2D1 is greater than T1D1. CCM 211 may also optionally cause controller 129 to compare the second temperature to a second temperature threshold (T2D2) for the second electronic device 123 within second compartment 107, wherein T2D2 is greater than T1D2. T2D1 and T2D2 may be each set to a temperature or a temperature range at which additional cooling of the second electronic device 123 is desired. For example, T2D1 may be set to a temperature or temperature range of the first electronic device 117 in first compartment 105 that is expected to cause the temperature of the second electronic device 123 in second compartment 107 to increase to a value in which supplemental cooling is desired. Similarly, T2D2 may be set to a temperature or temperature range of second compartment 107 at which supplemental cooling is desired.

T2D1 and T2D2 may be the same or different, and in some embodiments are the same. For example, in embodiments T2D1 and T2D2 are both set to a second temperature or temperature range, such as greater than 45° C. to about 60° C., such as from greater than 45° C. to about 54° C. Without limitation, T2D2 and T2D2 are both about 54° C.

When controller 129 determines that the first temperature is ≥T2D1 or the second temperature is ≥T2D2, CCM 211 may cause controller to issue a second control signal that is configured to cause active cooling components (e.g., one or more fans) within the second electronic device cooling system 127 to operate at a second duty level that is greater than the first duty level. For example, when second electronic device cooling system 127 includes a fan, the first control signal may cause the fan to turn on at a first duty level that ranges from greater than 0 to about 40% of the maximum speed of the fan when the first temperature is ≥T1D1 or the second temperature is ≥T1D2. When the first temperature is ≥T2D1 or the second temperature is ≥T2D2, the second control signal may cause the fan(s) within second electronic device cooling system 127 to operate at a second duty level that is greater than 40 to about 100% of the maximum rated speed for the fan. As before, controller 129 may set the second duty level, e.g., using pulse width modulation or another technique that provides control over the speed of the fan(s) within second electronic device cooling system 127. At this time, CCM 211 may optionally cause controller 129 to issue a second supplemental control signal that is configured to cause active cooling components within first electronic device cooling system 121 to turn operate at a second duty level that is greater than a first duty level at which they may have been previously operating. For example, controller 129 may cause active cooling components within first electronic device cooling system 121 to operate at a second duty level in response to a determination that the first temperature is ≥T2D1 and/or another temperature threshold for first electronic device 117.

As noted above, first temperature sensor 119 may be a temperature sensor that is integral with a first electronic device 117, such as an amplifier. Thus, when the first electronic device 117 is removed from the first compartment 105 or is powered down, a first temperature sensor signal may not be provided by the first temperature sensor 119. With that in mind, in some embodiments the second electronic device 123 (e.g., radios) within second compartment 107 may be operated independently of the first electronic device 117. For example, when first electronic device 117 is an amplifier and second electronic device 123 is a radio, the second electronic device 123 (radio) may be operated independently of the first electronic device (amplifier), resulting in the production of heat. To prevent overheating of the second electronic devices in such instances, the cooling systems of the present disclosure may be configured to operate even in the absence of a first temperature sensor signal from a first temperature sensor. When a first (ITS) sensor signal is not received, CCM 211 may cause controller 129 to store or determine the second temperature (i.e., the ambient temperature of second compartment 107) based at least in part on an (ATS) sensor signals received from the second temperature sensor 125. CCM 211 may then cause controller 129 to determine whether the second temperature exceeds one or more threshold operating temperatures for the second electronic device 123 in substantially the same manner as described above. That is, controller 129 may compare a detected ambient temperature of the second compartment to a first temperature threshold of the second electronic device 123 (i.e., T1D2).

As before, T1D2 may be set to a temperature or a temperature range at which cooling of the second electronic device 123 is to be initiated. For example, T1D2 may be set to a temperature or temperature range of second compartment 107 at which cooling is desired. For example, in embodiments T1D2 is set to a first temperature or temperature range, such as between about 30° C. to about 45° C., such as about 40° C. to about 45° C. Without limitation, in embodiments T1D2 is about 45° C.

When controller 129 determines that the second temperature is ≥T1D2, CCM 211 may cause controller to issue a first control signal that is configured to cause active cooling components (e.g., one or more fans) within the second electronic device cooling system 127 to operate at a first duty level. For example, when second electronic device cooling system 127 includes one or more fans, the first control signal may cause the fan(s) to turn on at a first duty level when the second temperature is ≥T1D2. As before, controller 129 may set the first duty level using pulse width modulation or another technique that provides control over the speed of the fan(s) within second electronic device cooling system 127. CCM 211 may also optionally cause controller 129 to issue a first supplemental control signal that is configured to cause active cooling components within first electronic device cooling system 121 to turn on (e.g., at a first duty level) when the first temperature is ≥T1D1 or another temperature threshold for the first electronic device.

CCM 211 may then cause controller 129 to continue to monitor the ATS signals from the second temperature sensor, store or determine the second temperature based at least in part on such ATS signals and compare the second temperature to corresponding additional temperature thresholds in the same manner as discussed above. For example, CCM 211 may cause controller 129 to compare the second temperature to a second temperature threshold (T2D2) for the second electronic device 123 within second compartment 107, wherein T2D2 is greater than T1D2. In embodiments, T2D2 is set to the ranges noted above.

When controller 129 determines that the second temperature is ≥T2D2, CCM 211 may cause controller to issue a second control signal that is configured to cause active cooling components (e.g., one or more fans) within the second electronic device cooling system 127 to operate at a second duty level that is greater than the first duty level. For example, when second electronic device cooling system 127 includes one or more fans, the first control signal may cause the fan(s) to turn operate at a first duty within the above noted ranges. When the first temperature is ≥T2D1 or the second temperature is ≥T2D2, the second control signal may cause the fan(s) within second electronic device cooling system 127 to operate at a second duty level that is greater than the first duty level and is within the above noted ranges. As before, controller 129 may set the second duty level, e.g., using pulse width modulation or another technique that provides control over the speed of the fan(s) within second electronic device cooling system 127. CCM 211 may also optionally cause controller 129 to issue a second supplemental control signal that is configured to cause active cooling components within first electronic device cooling system 121 to turn operate at a second duty level that is greater than a first duty level at which they may have been previously operating.

For the sake of ease of understanding the foregoing discussion focuses on embodiments in which controller 129 is configured to compare the first temperature and/or second temperature to two temperature thresholds, any suitable number of temperature thresholds may be used. For example, controller 129 may compare the first temperature or the second temperature to one or more than one threshold and may set the duty level of active cooling components with the second electronic device cooling system 127 accordingly. For example, when a single threshold is used (i.e., T1D1 or T1D2), controller 129 may cause fans or other active cooling components within second electronic device cooling system 127 to operate at greater than 0 to 100% of the cooling components rated duty level. Alternatively, controller 129 may compare the first temperature and second temperature to a plurality (e.g. 2, 3, 4, 5, or more) temperature thresholds (e.g., T1D1, T1D2, T2D1, T2D2, T3D1, T3D2, etc., wherein higher number thresholds are higher temperature than lower temperature thresholds, and cause the controller 129 to issue control signals that cause fans or other active cooling components within second electronic device cooling system 127 to operate at a corresponding duty level (with higher duty levels being implemented at higher temperatures).

While the foregoing discussion focuses on activating and increasing the duty level of active cooling components of second electronic device cooling system 127 in response to a detected temperature exceeding a threshold, the systems described herein can also reduce the duty level of active cooling components in response to a determination that a detected first or second temperature has fallen below a corresponding threshold for the first electronic device and/or the second electronic device. For example, when a first (ITS) temperature sensor signal is received, controller 129 may cause fans or other active components within second electronic device cooling system 127 to operate at predetermined duty level when the first temperature exceeds a first threshold as noted above. In such instances, controller 129 may continue to monitor the first (ITS) temperature sensor signal to determine whether the first temperature has exceeded a second threshold or has fallen below the first threshold. When it is determined that the first temperature has fallen below the first threshold, controller 129 may issue a control signal that reduces the duty level of the active cooling components of second electronic device cooling system 127 accordingly. If the first temperature falls below a minimum temperature threshold (i.e., a temperature threshold required for fans or other active cooling components of second electronic device cooling system 127 to turn on), controller 129 may issue a control signal that causes such components to turn off. Controller may perform similar operations when a first (ITS) temperature sensor signal is not received, i.e., based on a second (ATS) temperature sensor signal and a comparison of a second temperature to one or more thresholds for the second electronic device 123 as discussed above.

While the foregoing discussion and FIGS. 1A-1C and 2 focus on embodiments in which housing 101 includes two compartments that are configured to house two electronic devices (i.e., a first electronic device and a second electronic device), the systems described herein may be configured differently with a corresponding change in the operation of controller 129. For example, housing 101 may include three, four or more compartments, wherein each compartment is at least partially discrete from each other compartment and is configured to house at least one electronic device. For example, housing 101 may include a first compartment configured to house an amplifier, and second, and third compartments that are each configured to house a radio or other electronic device that may be used independently or in conjunction with the amplifier. The second and third compartments may each include a cooling system for the electronic components therein and an ambient sensor.

In such instances, a first temperature sensor (e.g., embedded within or otherwise included in a first electronic device in the first compartment) may detect a first temperature of at least a component of the first electronic device as discussed above, and produce a first sensor signal. Ambient sensors within each of the second and third compartments may detect the ambient temperature of such compartments and produce corresponding ambient temperature sensor signals. In such instances controller 129 may receive the first sensor signal and the ambient temperature sensor signals, and store or determine the first temperature of the first electronic device, a (first) ambient temperature of the second compartment, and a (second) ambient temperature of the third compartment. Controller 129 may compare the first temperature to a first and/or second temperature threshold for the first electronic device, i.e., T1D1 and/or T2D1 as noted above. When the first temperature is ≥T1D1 and/or T2D1, controller 129 may cause active cooling components within the cooling systems in the second and/or third components to operate at a first duty level. And when the first temperature is ≥T2D1, controller 129 may cause active cooling components within the cooling systems in the second and/or third components to operate at a second duty level that is higher than the first duty level.

Like the systems described in association with FIGS. 1A-2, controller 129 may also control operation of the active cooling components in the second and third compartments based on a comparison of the first ambient temperature and second ambient temperature to corresponding temperature thresholds for the second and third electronic devices, respectively. As the operations of controller 129 in that regard are essentially the same as described above in connection with FIGS. 1A-2, they are not described again in the interest of brevity.

As noted above the systems described herein can utilize a first temperature sensor signal from a first integral temperature sensor in a first electronic device in a first compartment as the basis for controlling operation of active cooling components of a second electronic device cooling system for a second cooling device in a second (or other) compartment that is at least partially discrete from the first compartment. One advantage of such a system is that because the first temperature sensor is integral with the first electronic device, it may detect changes in the temperature of at least a component of the first electronic device relatively quickly, compared to the rate at which the second temperature sensor can detect changes in the ambient temperature. When the first and second electronic devices are designed to work together or in a complimentary fashion (such as in the case of a radio and an amplifier), an increase in the temperature of the first electronic device (e.g., amplifier) can be directly correlated to an expected increase in the temperature of the second electronic device (e.g., radio). Thus, using the first temperature sensor signal from the first temperature sensor integral with the first electronic device can enable a controller to anticipate/predict increases (and decreases) in the temperature of the second electronic device, before such increases are detected by a second (ambient) temperature sensor. Consequently, a controller can proactively control a duty level of the active cooling components in a cooling system for the second electronic device based on cooling needs that are anticipated based on temperature data from a first electronic device in another compartment.

Figure 3:
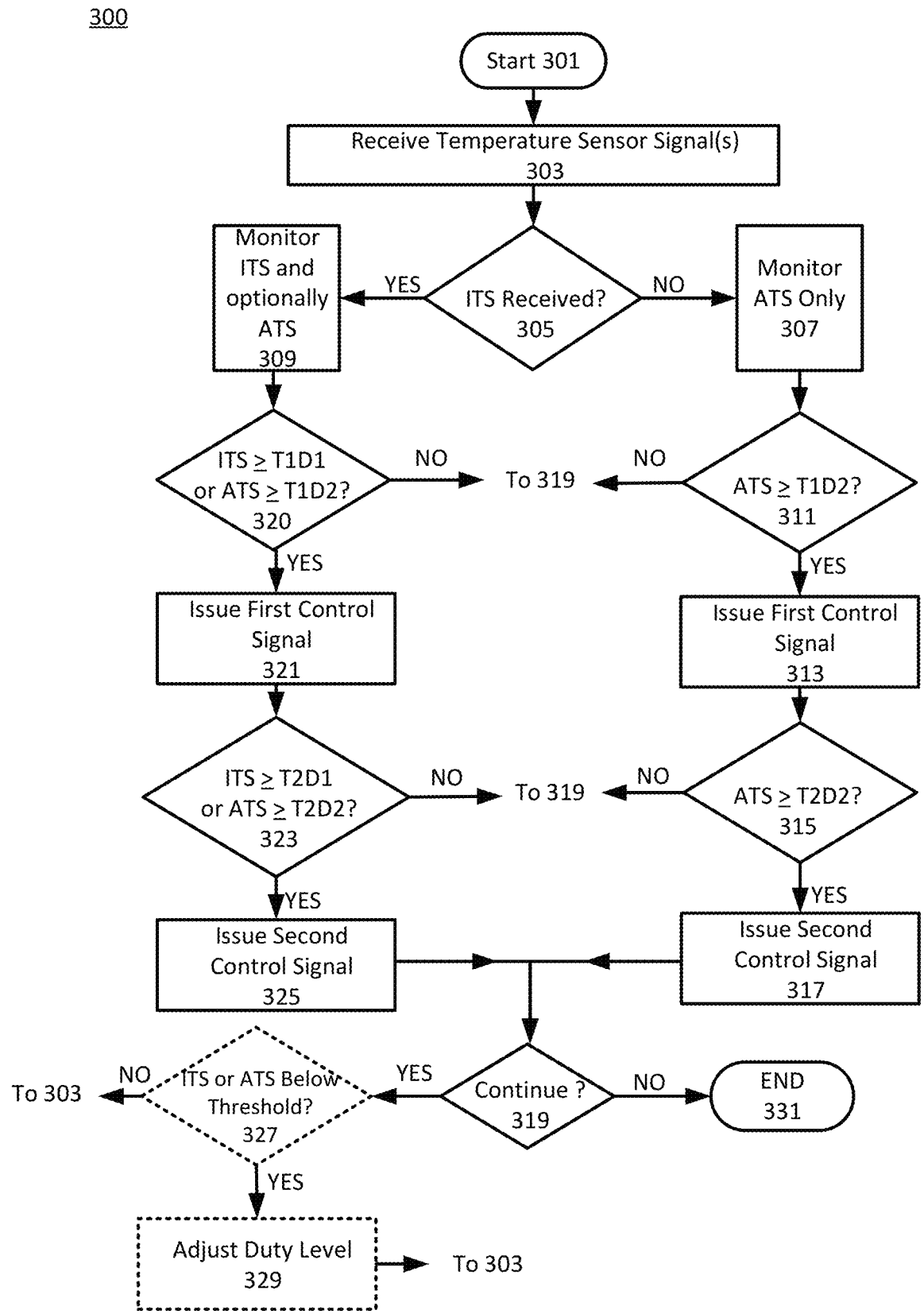
FIG. 3 is a flow diagram of one example of an adaptive cooling method consistent with the present disclosure.

Another aspect of the present disclosure relates to methods for adaptive cooling. In that regard reference is made to FIG. 3, which is a flow diagram of example operations of one example of a method of adaptive cooling consistent with the present disclosure. As shown, method 300 begins with block 301. The method may then proceed to block 303, pursuant to which temperature signals may be received, e.g., by a controller as discussed above. For example, pursuant to block 303 a controller may receive an integral temperature signal (ITS) from a first temperature sensor that is integral with a first electronic device in a first compartment of a housing of a cooling system, wherein the ITS is indicative of a detected temperature of at least a component of the first electronic device. Alternatively or additionally, the controller may receive an ambient temperature signal (ATS) from a second temperature sensor, wherein the ATS is indicative of a detected ambient temperature of a second compartment of a housing of a cooling system as discussed above.

The method may then proceed to block 305, pursuant to which a determination may be made (e.g., by a controller) as to whether an ITS was received. If not, the method may proceed to block 307, pursuant to which the controller may monitor the ATS only. The method may proceed from block 307 to block 311, pursuant to which the controller may determine whether the temperature indicated by the ATS is greater than or equal to a first threshold (T1D2) for a second electronic device housed or to be housed within the second compartment. If not, the method may proceed to block 319, pursuant to which a determination may be made as to whether the method is to continue. If not, the method may proceed to block 331 and end, but if so, the method may proceed to optional block 327, pursuant to which the controller may determine whether the ATS is below a relevant threshold, in this case T1D2. If not, the method may loop back to block 303, but if so, the method may proceed to optional block 329. Pursuant to optional block 329, the controller may optionally adjust a duty level of active cooling components of a second electronic device cooling system in the second compartment. After such adjustment, or if the operations of block 329 are omitted the method may loop back to block 303.

Returning to block 311, if the controller determines that that temperature indicated by the ATS is greater than or equal to T1D2, the method may proceed to block 313. Pursuant to block 313 the controller may issue or cause the issuance of a first control signal. As discussed above, the first control signal may be configured to cause active cooling components of a second electronic device cooling system within the second compartment to operate at a first duty level. The method may then proceed to block 315, pursuant to which the controller may determine whether temperature indicated by the ATS is greater than or equal to a second threshold temperature for the second device (i.e., T2D2). If not, the method may proceed to block 319, but if so, the method may proceed to block 317. Pursuant to block 317 the controller may issue or cause the issuance of a second control signal. As discussed above, the second control signal may be configured to cause active cooling components of the second electronic device cooling system to operate at a second duty level, wherein the second duty level is higher than the first duty level. The method may then proceed to block 319.

Returning to block 305, if the controller determines that an ITS has been received (and thus, an integral temperature sensor is present), the method may proceed to block 309. Pursuant to block 309 the controller may monitor the ITS and optionally the ATS signals. More specifically, the controller may store or determine a detected temperature of at least a component of a first electronic device within a first compartment of housing of a cooling system as discussed above. The controller may also optionally store or determine an ambient temperature of a second compartment of the housing of the cooling system based at least in part on the ATS signal as discussed above.

The method may then proceed to block 320, pursuant to which a determination may be made (e.g., by the controller) as to whether the temperature indicated by the ITS is greater than a first temperature threshold for the first electronic device (i.e., T1D1). Pursuant to block 320 the controller may also optionally determine whether the ambient temperature of the second compartment determined from the ATS is greater than or equal to a first threshold for a second electronic device in the second compartment. If only the ITS is monitored, the outcome of block 320 is dependent on whether the temperature indicated by the ITS is greater than or equal to T1D1. If the ATS is also monitored, the outcome block 320 may also depend on whether the temperature indicated by the ATS is greater than or equal to T1D2. For example, in the latter instance, the outcome of block 320 may be YES when the temperature indicated by the ITS is less than T1D1, but the temperature indicated by the ATS is greater than or equal to T1D2. In any event, if the outcome of block 320 is NO, the method may proceed to block 319. If the outcome of block 320 is yes, however, the method may proceed to block 321.

Pursuant to block 321 the controller may issue or cause the issuance of a first control signal. As discussed above, the first control signal may be configured to cause active cooling components of a second electronic device cooling system within the second compartment to operate at a first duty level.

The method may then proceed to block 323, pursuant to which the controller may determine whether temperature indicated by the ITS is greater than or equal to a second threshold temperature for the first electronic device T2D1, and/or the temperature indicated by the ATS is greater than or equal to a second threshold temperature for the second electronic device (i.e., T2D2). Like block 320, the outcome of block 323 may solely depend on the comparison of the temperature indicated by the ITS to T2D1 if an ATS is not being monitored by the controller. If the controller is also monitoring the ATS, however, the outcome of block 323 may be YES when the temperature indicated by the ITS is less than T2D1, but the temperature indicated by the ATS is greater than T2D2. In any event, if the outcome of block 323 is NO, the method may proceed to block 319. If the outcome of block 323 is yes, however, the method may proceed to block 325.

Pursuant to block 325 the controller may issue or cause the issuance of a second control signal. As discussed above, the second control signal may be configured to cause active cooling components of a second electronic device cooling system within the second compartment to operate at a second duty level that is greater than the first duty level. The method may then proceed to block 319.

As discussed above, pursuant to block 319 a determination may be made as to whether the method is to continue. If not (e.g., if power to the system is turned off) the method proceeds to block 331 and ends, but if so, the method may proceed to optional block 327. As may be appreciated, the operations of optional block 327 may be performed when the controller previously issued or caused the issuance of a control signal that caused active cooling components of the second electronic device cooling system to operate at a designated duty level. Specifically, pursuant to block 327, the controller may determine whether the temperature indicated by the ITS and/or the ATS has fallen below a relevant threshold. If so, the method may proceed to optional block 329, pursuant to which the controller may issue a (third) control signal that is configured to adjust the duty level of the active cooling components of the second electronic device cooling system accordingly. Specifically, the (third) control signal may be configured to reduce the duty level of the active cooling components of the second electronic device cooling system, and potentially to turn such components off, e.g., when the temperature indicated by the ITS and/or ATS falls below the lowest temperature threshold for the first and/or second electronic device.

Figure 4A:
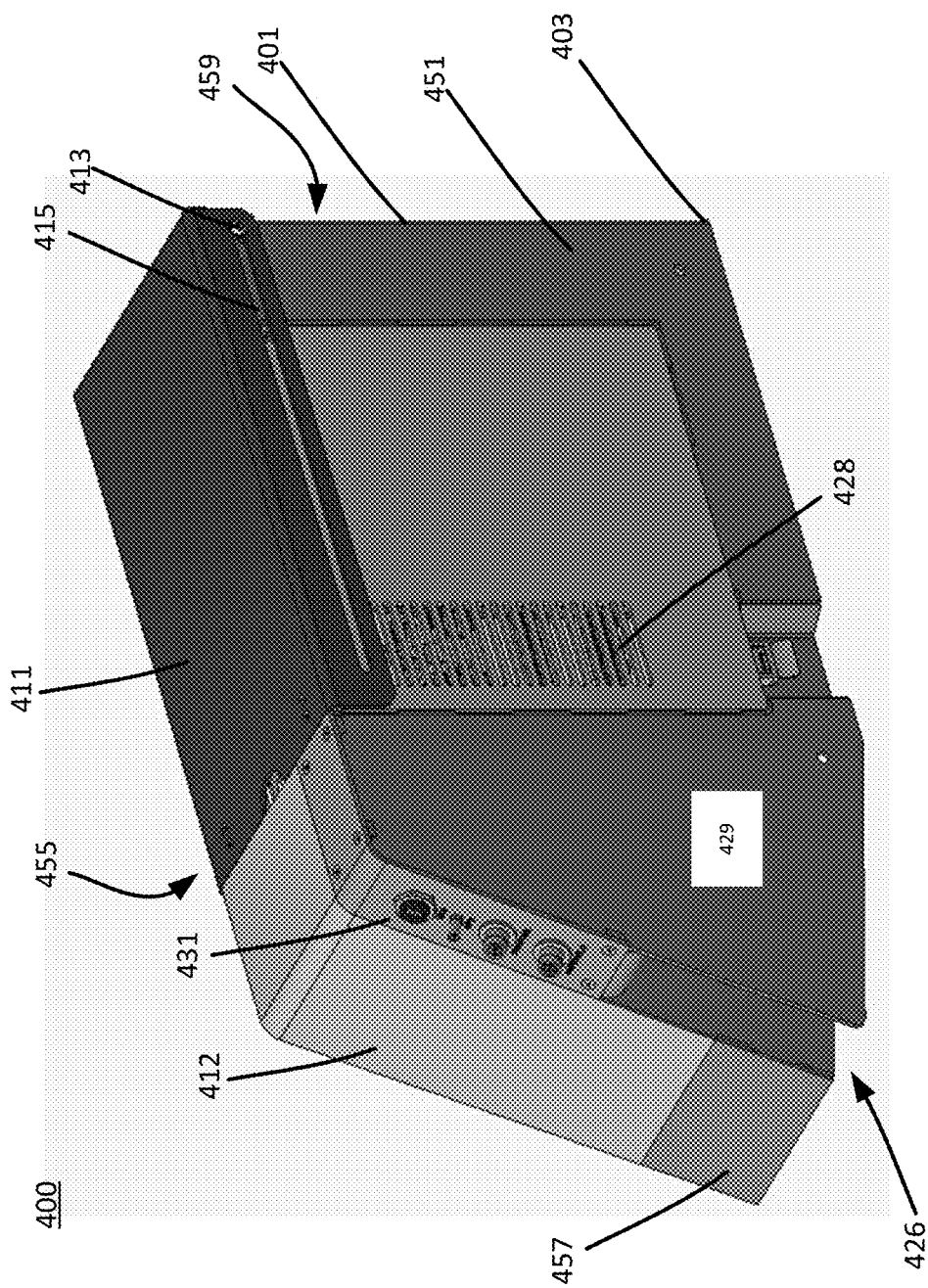
FIG. 4A is a right side perspective view of one example of a vehicle center console including an adaptive cooling system consistent with the present disclosure.
Figure 4B:
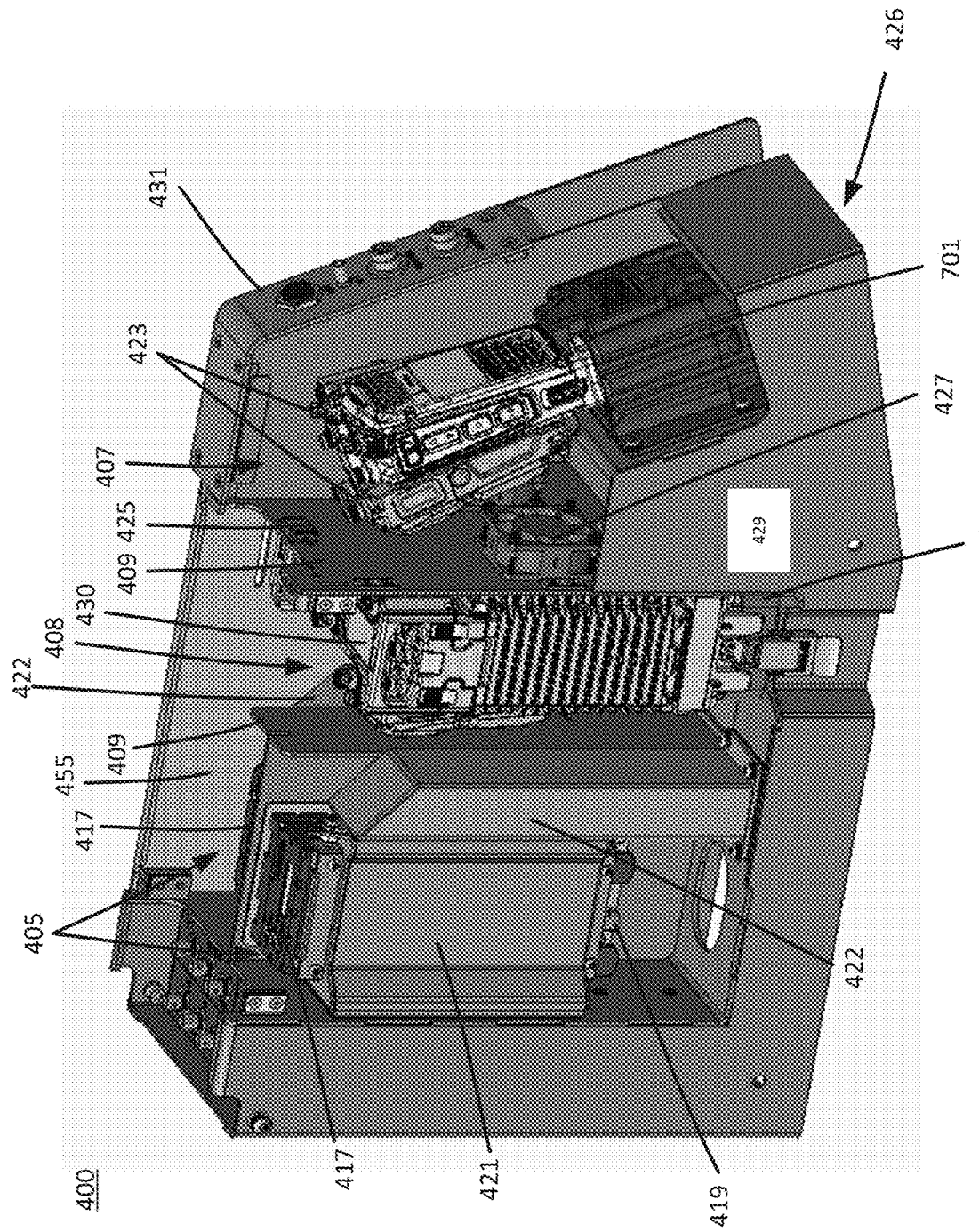
FIG. 4B is a left side perspective view of the vehicle center console of FIG. 4A, with the left side cover, top, and front cover removed.
Figure 4C:
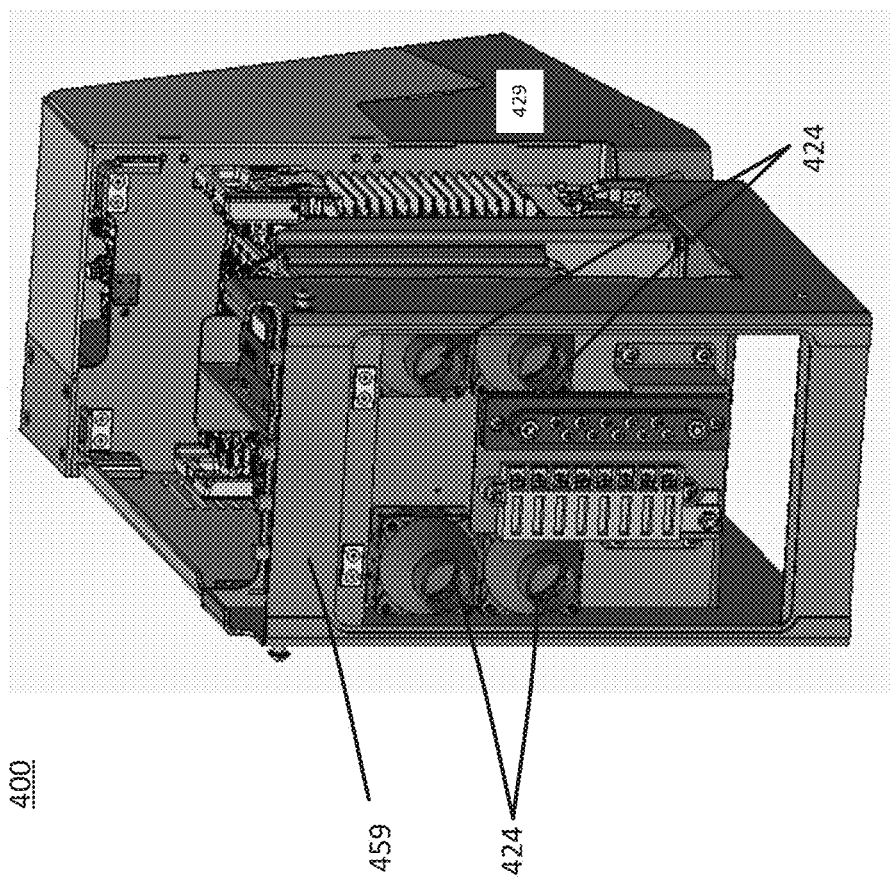
FIG. 4C is a rear perspective view of the vehicle center console of FIG. 4A, with the left side cover, top, and front cover removed.
Figure 5:
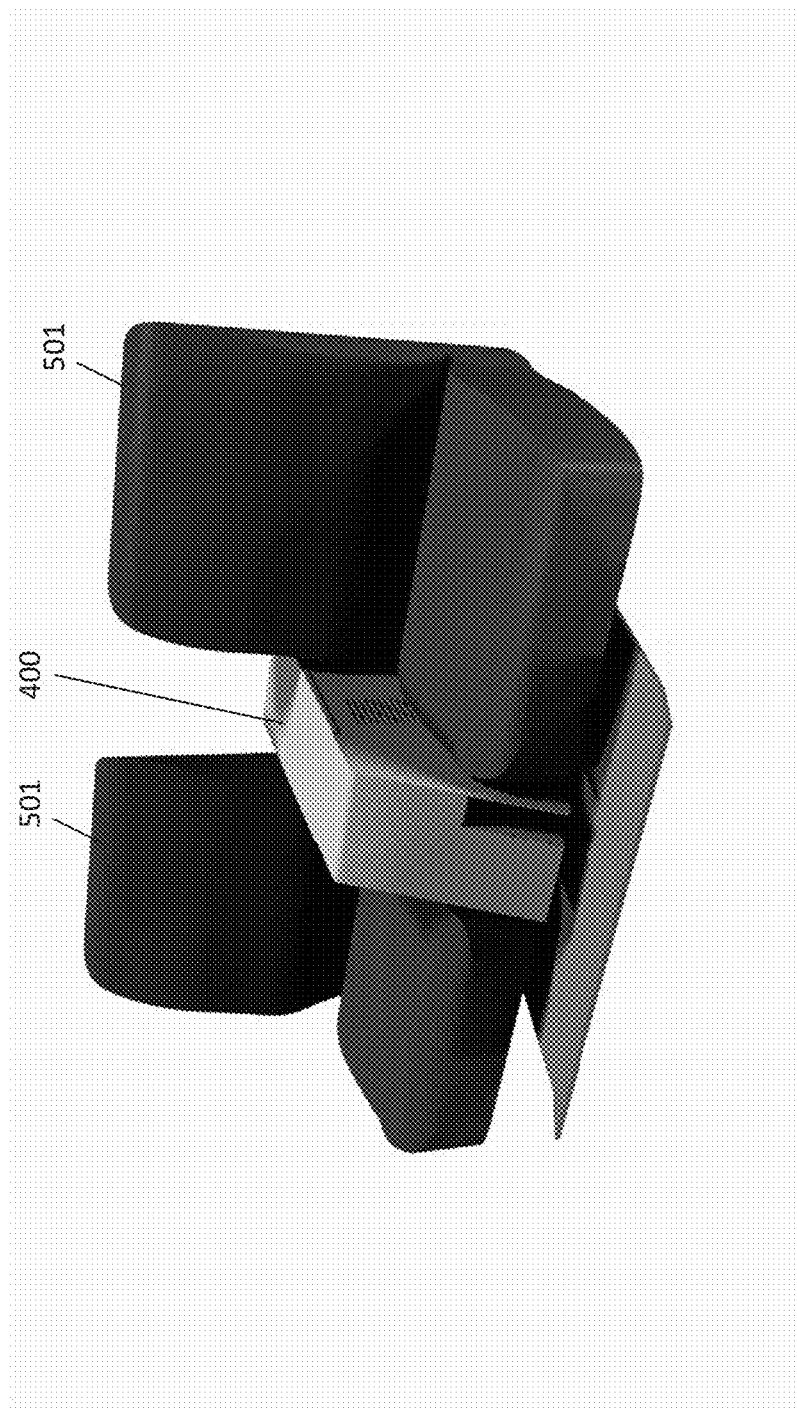
FIG. 5 is a schematic drawing of a vehicle center console including an adaptive cooling system consistent with the present disclosure, in an example installed condition.

Reference is now drawn to FIGS. 4A-4C, which depict one example of an adaptive cooling system 400 consistent with the present disclosure, in the form of a vehicle center console. As shown in FIG. 5, system 400 is configured to fit between the front seats 501 of a vehicle, such as but not limited to an automobile. As best shown in FIG. 4A, system 400 includes a housing 401, a base 403, and a top cover 411. The housing includes a right side 451, a left side 455, a front side 457, and a rear side 459. As best shown in FIG. 4B, housing 401 defines a cavity that is separated into a plurality of compartments. Specifically, housing 401 includes two "first" compartments 405, each of which in this case is configured to house a first electronic device 417, e.g., an amplifier. Housing 401 further includes a second compartment 407, which in this case is configured to house one or a plurality of second electronic devices 423, e.g., handheld radios. Housing 401 also includes a third compartment 408, which in this case is configured to house a third electronic device 430, e.g., a manpack style radio system. Dividers 409 separate the first, second, and third compartments 405, 407, 408 such that they are at least partially discrete from one another. Although not labeled, dividers 409 may include holes or other pass through that facilitate the electrical coupling of the first, second, and third electronic devices 417, 423, 430 to one another, e.g., via one or more cables.

System 400 may also include a connection panel 431. When used, connection panel 431 may be configured to enable auxiliary devices to be connected to electronic devices that may be contained within system 400. For example, when first electronic devices 417 are amplifiers, second electronic devices 423 are handheld radios, and third electronic device 430 is a manpack style radio, connection panel 431 may enable a user to connect auxiliary equipment to any of those devices.

Returning to FIG. 4A, top cover 411 is configured to transition between a closed state (shown in FIG. 4A) in which the top of first and third compartments 407, 408 is concealed, to an open state in which first and third compartments 405, 408 are accessible by a user. In that regard top cover 411 includes two side extensions that extend over at least a portion of right and left sides 451, 455 of housing 401. The side extensions each include a channel 415 that that extends from a point proximate rear side 459 to a point proximate front side 457. The channel 415 is configured to ride on pins 413 on the right and left sides 451, 455, such that top cover can be moved to an open position in the same manner described above with regard to lid 111 in FIGS. 1A-1C. Alternatively, top cover 411 may be configured such that it can be easily removed from system 400. Still further, top cover 411 may be coupled to housing 401 via a hinge such that it may be hingedly moved between an open and a closed position by rotation about the hinge.

Front cover 412 is configured to transition between a closed state (shown in FIG. 4A) in which second compartment 407 is concealed, and an open state in which second compartment 407 is accessible to a user. The manner in which front cover 412 is coupled to housing 401 is not limited, provided that it can be removed or otherwise transitioned from a closed state to an open state and vice versa. In embodiments, front cover is coupled to housing 401 via at least one hinge, such that it may be moved between an open and closed state by rotation about the hinge.

With further reference to FIG. 4B, system 400 further includes a first temperature sensor 419. Without limitation, the first temperature sensor 419 is an integral temperature sensor that is configured to measure a temperature of at least a component of a first electronic device 417, as discussed above. In such instances when multiple first electronic devices 417 are present, multiple first temperature sensors 419 may also be present. For the sake of illustration, first temperature sensor 419 is illustrated in FIG. 4B as coupled to a bottom side of a first electronic device 417, but such a configuration is not required and first temperature sensor 419 may be positioned differently.

System 400 further includes at least one second temperature sensor 425. Consistent with the foregoing discussion, the second temperature sensor 425 is generally configured to detect an ambient temperature of second compartment 407 and to produce a second temperature sensor signal indicative of the ambient temperature of second compartment 407. For the sake of illustration, FIG. 4B shows second temperature sensor 425 as being attached to a side of a divider 409 that faces the interior of second compartment 407. Such a configuration is not required, and second temperature sensor can be placed in any location that enables it to detect the ambient temperature of second compartment 407.

Although not shown, system 400 may include more than one second temperature sensor. In such instances the plurality of second temperature sensors may each be located such that they can detect the ambient temperature of the second compartment 407. Alternatively, one or more second temperature sensors may be placed such that it/they can detect the ambient temperature of third compartment 408. In such instances, control over the operation of cooling components within system 400 may be performed in substantially the same manner as described above in connection with FIGS. 1A-1C, except that a sensor signal/temperature from the sensor detecting the temperature of the third compartment 408 may also be taken into account. Specifically, the sensors signal/temperature from the sensor detecting the temperature of the third compartment 408 may be utilized in the same manner as the sensor signal from second sensor 425 that detects the ambient temperature of the second compartment 407.

System 400 further includes a first electronic device cooling system 421, a first compartment inlet 422, and a first compartment outlet 424 (best shown in FIG. 4C). In this case, first electronic device cooling system 421 is depicted as including a heat sink that is mounted or otherwise coupled to a surface of first electronic device 417. First electronic device cooling system 421 generally functions to draw heat away from first electronic device 417, as would be understood by one of ordinary skill in the art. The first electronic device cooling system 421 may include a fan or other active component which draws a first relatively cool inlet air stream in through first compartment inlet 422, e.g., from a point proximate a bottom of housing 401. The first compartment inlet air stream may be directed over or through the first electronic device cooling system 421 (e.g., through or over a heat sink), such that heat is transferred from the first electronic device cooling system 421 to the first compartment inlet air stream. The resulting relatively warm outlet air stream is then exhausted from system 400 via first compartment outlets 424. As best shown in FIG. 4C, the first compartment outlets 424 may include one or more plenums, wherein a fan is mounted between the plenum and an outlet opening through the rear side 459 of housing 401. When used, such fans may operate to draw the first compartment inlet air stream through first compartment inlet 422, across/through first electronic device cooling system 421, and out of the first compartment outlet(s) 424. In this embodiment, system 400 includes two "first" electronic devices 417 which are housed in two respective "first" compartments 405. As such, system 400 includes two sets of "first" cooling systems and associated inlets and outlets. Such a configuration is not required, however, and system 400 may include one or more than one (e.g., 2, 3, 4, 5, 6) first compartments 405, which may house a corresponding number of first electronic devices 417.

As further shown in FIG. 4B, system 400 includes a second electronic device cooling system 427. Consistent with the foregoing discussion of second electronic device cooling system 127, second electronic device cooling system 427 includes one or more active cooling components that are configure to actively cool one or more second electronic devices 423 within second compartment 407. In this embodiment, second electronic device cooling system 427 includes a plurality of fans, wherein the fans have a variable fan speed (duty level) that may be controlled in any suitable manner, such as via pulse width modulation. In operation, the fans of second electronic device cooling system 427 are configured to draw a second relatively cool inlet air stream into second compartment 407 via a second compartment inlet 426, which in this case is located near the bottom front of housing 401. As the relatively cool inlet air stream flows through second compartment 407, it may remove heat from second electronic devices 423, resulting in the production of a relatively warm second compartment outlet air stream. The fans of second electronic device cooling system 427 are configured to convey the second compartment outlet air stream to a second compartment outlet 428, e.g., via ducting or in another manner.

Figure 6:
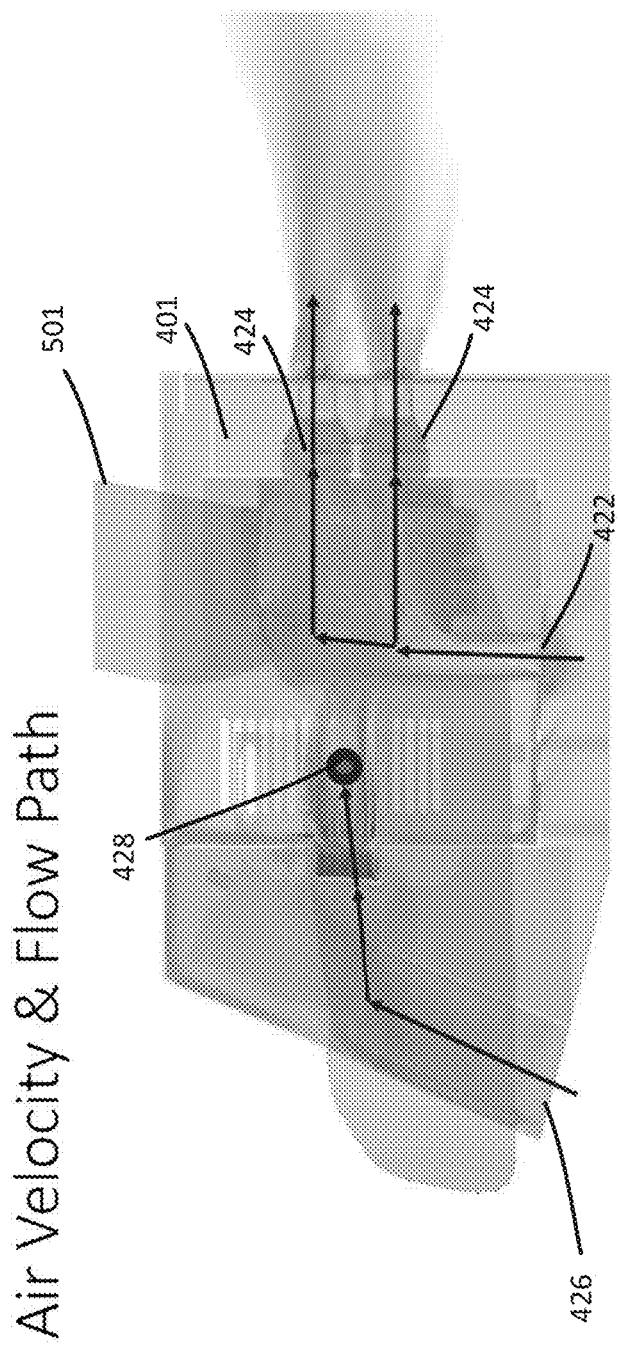
FIG. 6 is a diagram illustrating air flow through one example of a vehicle center console including an adaptive cooling system consistent with the present disclosure.

As best shown in FIG. 6, due to the position of the first and second compartment outlets 424, 428 the first and second compartment outlet air streams are directed out of the rear side 459 and right side 451 of housing 401. As a result, the relatively warm first and second compartment outlet air streams are exhausted in a direction away from the first and second compartment inlets 422, 426.

System 400 further includes a controller 429. While FIGS. 4A-4C depict controller 429 as being disposed under second compartment 407, such a configuration is not required and controller 429 may be located at any suitable location within or outside of system 400. As the nature and function of controller 429 is generally the same as controller 129 in FIGS. 1A-1C, and thus the nature and operation of controller 429 is not described again in detail in the interest of brevity. With that in mind, controller 429 is generally configured to receive sensor signals from one or more of the first temperature sensor(s) 419 and second temperature sensor(s) 425. When a sensor signal is received from a first temperature sensor 419, controller 429 may control the operation of active cooling components (e.g., fans) in second electronic device cooling system 427 based at least in part on that sensor signal, e.g., by comparing a detected temperature of a component of first electronic device 417 to one or more temperature thresholds for the first electronic device. Controller 429 may also control the operation of second electronic device cooling system 427 based at least in part on a sensor signal provided by a second (ambient) temperature sensor, as described above.

Figure 7:
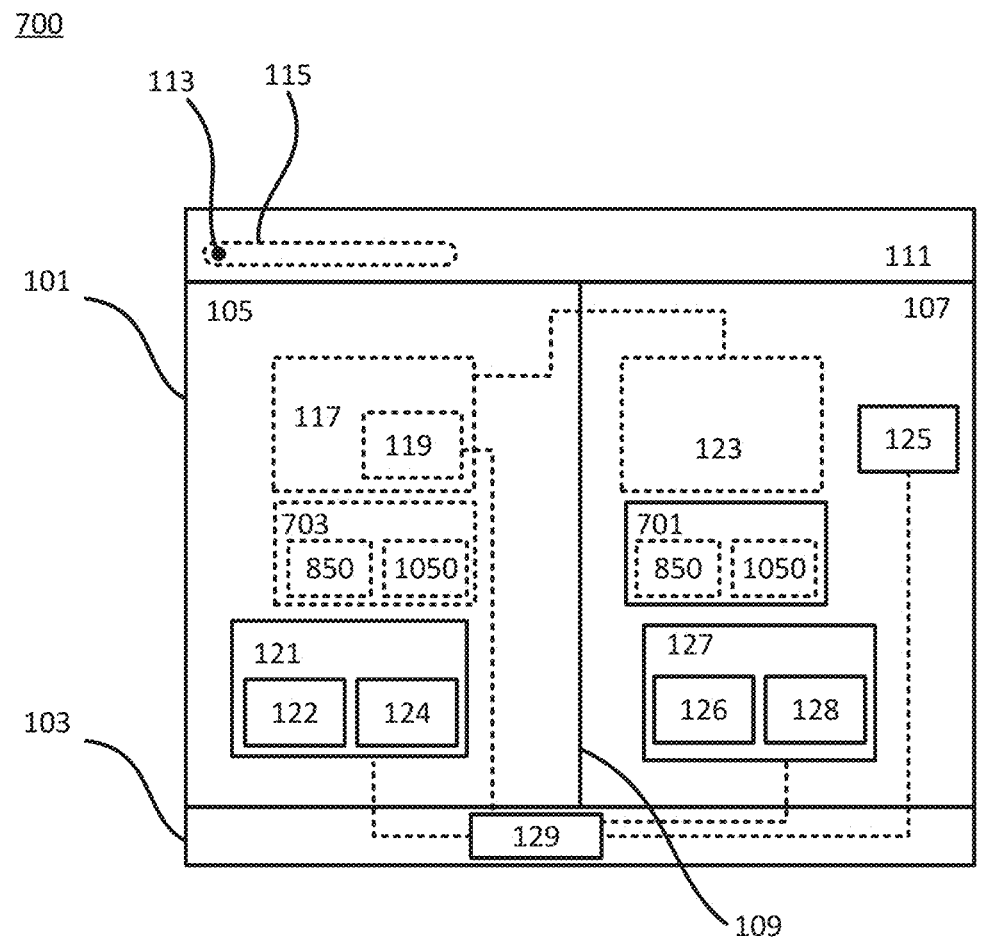
FIG. 7 is a block diagram of one example of an adaptive cooling system including a docking station consistent with the present disclosure.

Turning now to FIG. 7, there is illustrated a block diagram of one example of an adaptive cooling system including a docking station consistent with the present disclosure. As shown, system 700 includes many of the same elements as system 100. As such elements were described previously in connection with FIGS. 1A-1C, they are not redescribed here in the interest of brevity. In addition to such components, system 700 includes a first docking station 701. First docking station 701 is located within second compartment 107. The location of first docking station 701 is not limited, however, and it may be placed at any suitable location. In the embodiment of FIG. 7, first docking station 701 is generally configured to couple second electronic device 123 (e.g., a Manpack, HMS leader system, handheld radio, or the like) to a source of external power (i.e. a power source external to second electronic device 123), and/or to provide a data connection between second electronic device 123 and another device that is inside or outside second compartment 107 or even outside system 700 (e.g., a control panel, a computing system, combinations thereof, and the like). In embodiments and as will be described below, first docking station 701 may include or be in the form of a battery eliminator 850, an uninterruptible power supply (UPS) 1050, or a combination thereof. In some embodiments, first docking station 701 is physically configured such that lid 111 may be in the closed position when second electronic device 123 is in second compartment 107 and is coupled to first docking station 701.

System 700 may optionally include a second docking station 703. In the illustrated embodiment, second docking station 703 is in first compartment 105. The location of second docking station 703 is not limited, however, and it may be placed anywhere. In the illustrated embodiment, second docking station 703 is configured to couple first electronic device 117 (e.g., an amplifier, a handheld radio, a Manpack, an HMS leader system, or the like) to a source of external power (i.e., a power source external to first electronic device 117) and/or to provide a data connection between first electronic device 117 and another device that is inside or outside first compartment 105 or even outside system 700. In embodiments and as will be described below, second docking station 703 may include or be in the form of a battery eliminator 850, an uninterruptible power supply (UPS) 1050, or a combination thereof. In some embodiments, first docking station 701 is physically configured such that lid 111 may be in the closed position when first electronic device 117 is in first compartment 105 and is coupled to second docking station 703.

Figure 8:
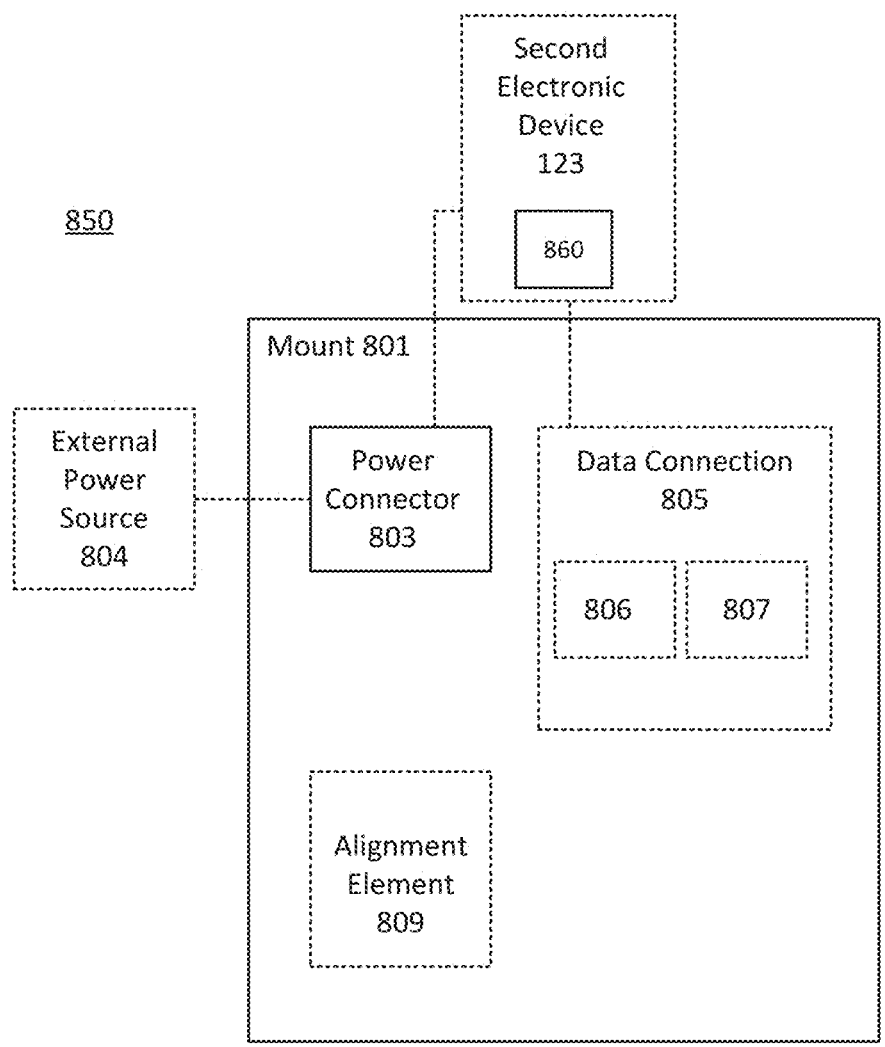
FIG. 8 is a block diagram of a battery eliminator that can be used in a docking station consistent with the present disclosure.

FIG. 8 is a block diagram of one example of a battery eliminator that may be used as or in first docking station 701 and/or second docking station 703. In general, battery eliminator 850 is configured to provide a connection to a source of external power that may be used to run an electronic device (e.g., first or second electronic devices 117, 123) independent of a power source 860 (e.g., a permanent or removable battery) that may be traditionally used to power such devices. As shown, battery eliminator 850 includes a mount 801, a power connector 803, a data connection 805, and an optional alignment element 809.

Mount 801 may be physically configured to receive at least a portion of an electronic device therein, such as but not limited to one or more of first and/or second electronic devices 117, 123. For example, when first or second electronic devices 117, 123 is/are in the form of a radio (e.g., a Manpack, HMS leader system, handheld radio), mount 801 may be configured to receive and/or couple to a side or part of first or second electronic devices 117, 123 bearing a power and/or data connector. Many handheld and Manpack radio systems are configured with device power and device data connectors that are located on one side of a body thereof, such as on a bottom thereof. In such instances mount 801 may be configured to receive and/or couple to the side of such devices bearing the device power and/or device data connectors, facilitating the formation of a connection between the device power/data connectors with corresponding connectors of battery eliminator 850.

Power connector 803 is generally configured to couple an electronic device that is coupled to mount 801 to an external power source 804, i.e., a power source external to the electronic device. This concept is shown in FIG. 8, which depicts power connector 803 as providing a connection between an external power source 804 and second electronic device 123. The configuration of power connector 803 is not limited, and any suitable type of power connector may be used. In embodiments, power connector 803 is compatible with a corresponding device power connector on an electronic device that is to be coupled to battery eliminator 850. For example, when second electronic device 123 is a radio (such as a Manpack, HMS leader system, or handheld radio) with a first device power connector, power connector 803 may be configured such that it can mate with the first device power connector and provide power to second electronic device independent of its power source 860. In particular, power connector 803 may be configured to mate with a device power connector of an electronic device when the electronic device is coupled to mount 801. In embodiments, second electronic device 123 is a Manpack radio such as a PRC-117G, PRC-162, PRC-158, or PRC-167 Manpack radio, and power connector 803 is configured to couple to a device power connector on one or more of such radios.

Data connection 805 is generally configured to communicatively couple an electronic device that is coupled to mount 801 to another device that is inside or outside first compartment 105 or even outside system 700. Non-limiting examples of such other devices include control panels, computing systems, communications systems, encryption/description systems, combinations thereof, and the like. In that regard, data connection may be configured to facilitate or enable communication between an electronic device coupled to mount 801 (e.g., second electronic device 123) and another device, e.g., via one or more currently known or future developed wired or wireless communications protocols. Without limitation, in embodiments data connection is configured to provide a physical data link between an electronic device (e.g., first or second electronic device 117, 123) and another device. In that regard, in embodiments data connection 805 includes a data connector 806, wherein data connector 806 is a first physical data connector that is configured to mate with a second physical data connector on the electronic device (e.g., first or second electronic device 117, 123), and which is configured to communicatively couple to another device as described above. Non-limiting examples of suitable first physical data connectors that may be used as data connector 806 include male and/or female pin connectors (e.g., 8, 9, 25, 50, 75, 100 pin male/female connectors such as HD and DB type connectors), universal serial bus (USB) connectors, ethernet connectors, coaxial connectors, SCSI connectors, DIN-type connectors, fiber optic connectors, serial port connectors, parallel port connectors, combinations thereof, and the like. Without limitation, in embodiments data connector 806 is a male or female 50 pin connector.

In any case, data connector 806 is configured such that is it compatible (i.e., can mate with) a corresponding device data connector on an electronic device that is to be coupled to battery eliminator 850. For example, when second electronic device 123 is a radio (such as a Manpack, HMS leader system, or handheld radio) with a first device data connector, data connector 806 may be configured such that it can mate with the first device data connector to communicatively couple the first electronic device 117 or second electronic device 123 to another device as described above. In particular, data connector 806 may be configured to mate with a device data connector of an electronic device when the electronic device is coupled to mount 801. In embodiments, first electronic device 117 or second electronic device 123 is a Manpack or handheld radio that includes a device data connector, and data connector 806 is configured to couple with the device data connector when the Manpack or handheld radio is coupled to mount 801.

Alternatively, or in addition to data connector 806, data connection 805 may optionally include a data pass through 807. In general, data pass through 807 is a conduit through mount 801 that is sized and configured to receive one or more data cables therethrough, e.g., for coupling to a data connector of an electronic device, such as first or second electronic devices 117, 123. Such a data pass through may be useful to accommodate current or future developed cabling, data connectors, etc. that are difficult to integrate into battery eliminator 850. In instances where data pass through 807 is included, data connector 806 may be included or omitted.

Battery eliminator 850 may optionally include one or more alignment elements, such as alignment element 809. When used, such alignment elements may facilitate alignment and mating of power connector 803 and data connection 805 with corresponding device power and device data connectors on an electronic device that is to be coupled to mount 801. For example and as noted above, mount 801 may be configured to couple to a bottom or other side of an electronic device (e.g., radio) that bears a device power and/or data connector. In such instances, the side of the electronic device to be coupled to mount 801 may include device alignment features (e.g., protuberances, recesses, indents, channels, combinations thereof, and the like) that are formed in or extend from the same side of the device that bears the device power and device data connections. In such instances, alignment element 809 may include one or more dock alignment features (e.g., pins, posts, recesses, protrusions, indents, combinations thereof, and the like) that correspond to the device alignment features. By aligning the device alignment features with the dock alignment features of alignment element 809, power connector 803 and data connector 805 may be properly oriented and aligned with corresponding device power and data connectors on the electronic device, thereby allowing such connectors to properly couple with one another when the electronic device is brought into engagement with mount 801. Without limitation, in embodiments alignment element 809 is used and includes one or more dock alignment pins or dock alignment recesses, wherein the alignment pins/recesses are positioned to align with corresponding device alignment recesses or device alignment pins of an electronic device when the electronic device is properly coupled to mount 801.

Figure 9A:
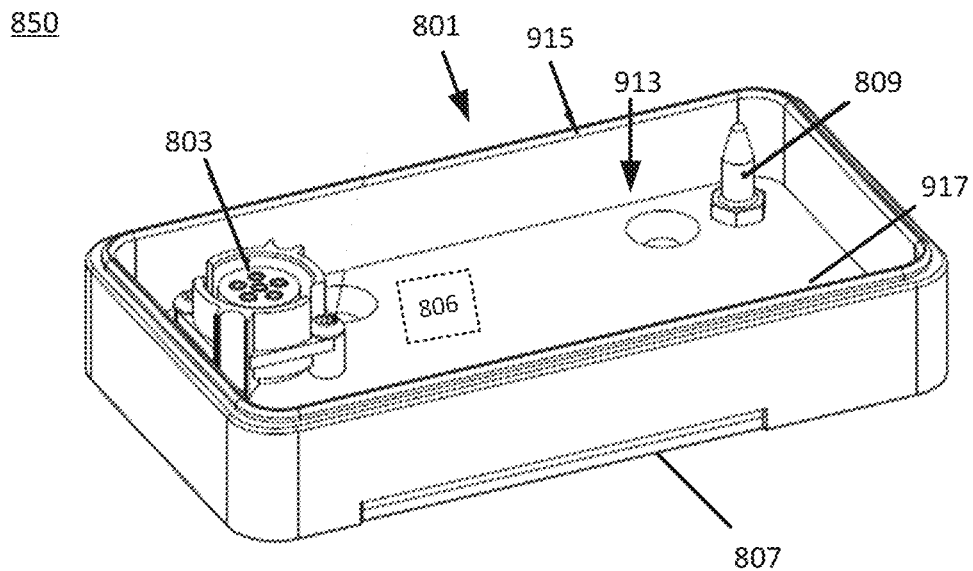
FIGS. 9A and 9B depict another example of a battery eliminator that can be used in a docking station consistent with the present disclosure.
Figure 9B:
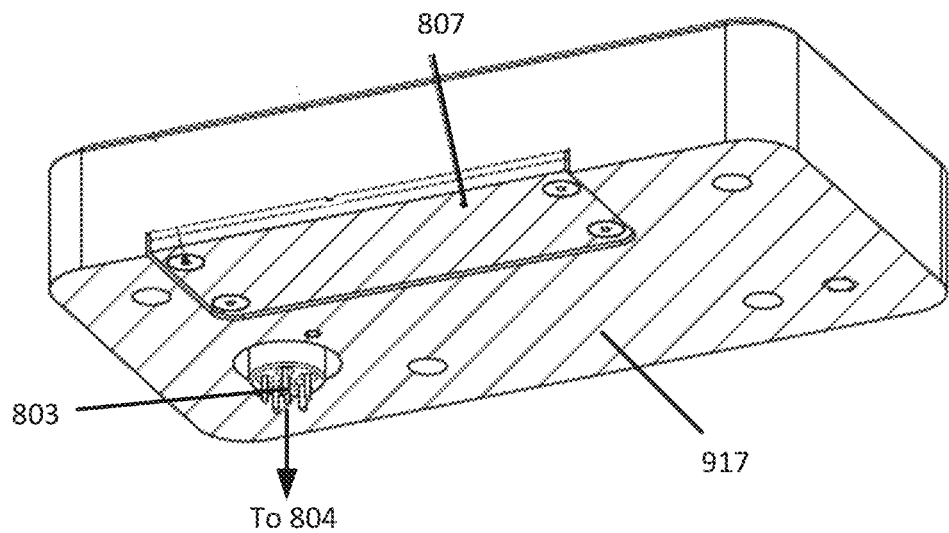

FIGS. 9A and 9B depict another example of a battery eliminator 850 consistent with the present disclosure. In this embodiment, battery eliminator 850 includes a mount 801, a power connector 803, an optional data connector 806, an optional data pass through 807, and an alignment element 809. The nature and function of many of the elements of FIGS. 9A and 9B are described previously in connection with FIG. 8 and so are not described in detail again.

As shown, in this embodiment mount 801 includes a mounting recess 913 defined at least in part by a wall 915 and a bottom 917. The mounting recess 913 is sized configured to receive at least a portion of an electronic device that includes a device power connector and optionally a device data connector. For example, mounting recess 913 may be sized and configured to receive a bottom or other side of a radio such as a Manpack or handheld radio therein, wherein the side of the radio includes a device power connector and optionally a device data connector. Wall 915 is preferably configured to abut at least a portion of an electronic device to facilitate snug retention of the electronic device when it is received in recess 913.

Alignment element 809 in this embodiment is in the form of a pin that extends from bottom 917, and which is configured to be insertable into a corresponding device alignment recess on a surface of an electronic device to be received within recess 913. Alignment of the alignment pin with the corresponding device alignment recess may facilitate alignment of power connection 803 with a corresponding device power connector of an electronic device to be inserted into recess 913. Alignment of the alignment pin with the corresponding device alignment recess may also facilitate alignment of optional data connector 806 with a device data connector of an electronic device to be inserted into recess 913.

In this embodiment mount 801 further includes data pass through 807. All or a portion of data pass through 807 may be removed from mount 801 to provide a conduit therethrough.

Figure 10:
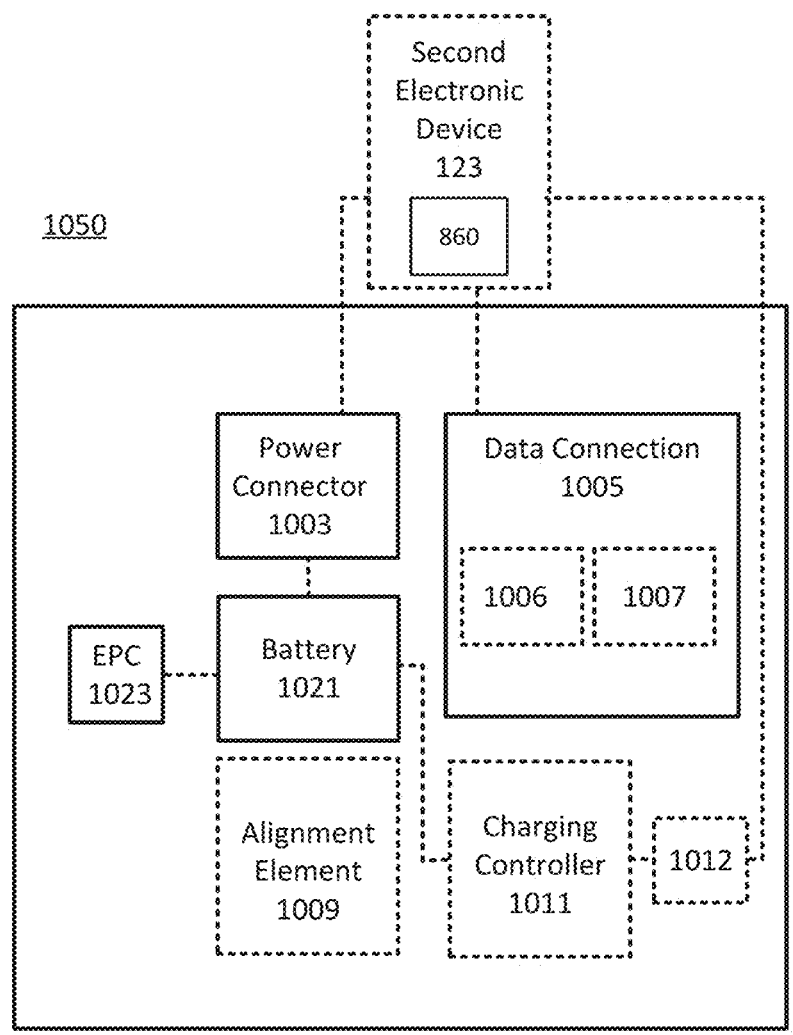
FIG. 10 is a block diagram of one example of an uninterruptible power supply (UPS) that can be used in a docking station consistent with the present disclosure.
Figure 11:
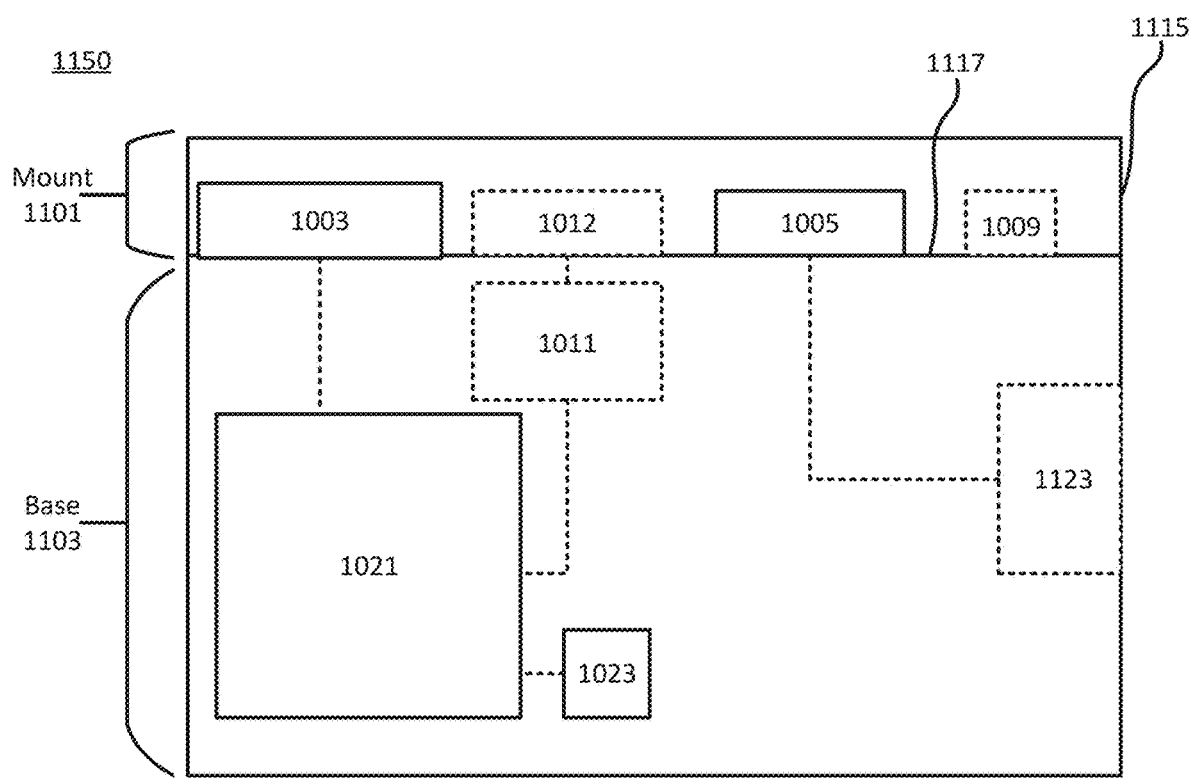
FIG. 11 is a schematic diagram of another example of a UPS that can be used in a docking station consistent with the present disclosure.

FIG. 10 is a block diagram of one example of an uninterruptible power supply (UPS) that may be used as or in first docking station 701 and/or second docking station 703. In general, UPS 1050 is configured to provide a source of external power that may be used to run an electronic device (e.g., first or second electronic devices 117, 123) independent of a power source 860 (e.g., a permanent or removable battery) that may be traditionally used to power such devices. As shown, UPS 1050 a power connector 1003, a data connection 1005, a battery 1021 and an external power connector (EPC) 1023. UPS 1050 may also include an optional alignment element 1009, charging controller 1011, and/or charging controller connector 1012. Power connecter 1003, data connection 1005, optional alignment element 1009, and optional charging controller connector 1012 may be coupled to or extend from a surface of a mount. In contrast, battery 1021, EPC 1023, and optional charging controller 1011 may be disposed within a base that is integral with or coupled to the mount. Such concepts are illustrated in FIG. 11, which shows an embodiment of UPS 1050 that includes a mount 1101 and a base 1103, wherein the mount 1101 and base 1103 include the above noted elements.

Like mount 801, mount 1101 may be physically configured to receive at least a portion of a first or second electronic devices 117, 123 therein. For example, when first or second electronic devices 117, 123 is/are in the form of a radio (e.g., a Manpack, HMS leader system, handheld radio), mount 1101 may be configured to receive and/or couple to a side or part of first or second electronic devices 117, 123 bearing a power and/or data connector. For example, many handheld and Manpack radio systems are configured with device power and device data connectors that are located on one side of a body thereof, such as on a bottom thereof. In such instances, mount 1101 may be configured to receive and/or couple to the side of such devices, facilitating the formation of a connection between the device power/data connectors with corresponding power connector 1003 and/or data connection 1005.

Like power connector 803, power connector 1003 is generally configured to couple an electronic device that is coupled to UPS 1050 (or, more specifically, to mount 1101) to an external power source. In this instance, the external power source is battery 1021, which may be disposed within UPS 1050. This concept is shown in FIGS. 10 and 11, which depict battery 1021 as being electrically coupled through power connector 1003 to second electronic device 123. The configuration of power connector 1003 is not limited, and any suitable type of power connector may be used. In embodiments, power connector 1003 is compatible with a corresponding device power connector on an electronic device that is to be coupled to Uninterruptable Power Supply 1050. Non-limiting examples of suitable power connectors include those noted above for power connector 803.

Battery 1021 is configured to provide electrical power for the operation of an electronic device coupled to power connector 1003, e.g., first or second electronic devices 117, 123. The nature and configuration of battery 1021 is not limited any suitable battery may be used. In embodiments, battery is configured to provide alternating or direct current to power connector 1003 for provision to an electronic device connected thereto. In embodiments, battery 1021 is battery that can be recharged from an external power source. In that regard, battery 1021 may be coupled to external power connector 1023, wherein external power connector (EPC) 1023 is configured to electrically couple battery 1021 to an external source of electric power. In embodiments, EPC 1023 is a connector for coupling battery 1021 to a source of direct or alternating current.

UPS 1050 may be configured to provide electric power to power source 860 (e.g., an internal or removable battery) of second electronic device 123. In such instances, UPS 1050 may be configured to provide charging power to power source 860, to support operation of second electronic device 123 from electric power provided by power source 860. In such instances, UPS 1050 may optionally include a charging controller 1011. When used, charging controller 1011 may be configured to monitor and control charging of the power source of an electronic device coupled to power connector 1003. In embodiments, charging controller 1011 may monitor the voltage of power source 860 and control the charging voltage supplied by power connector 1003 and battery 1021 to avoid damage to power source 860. In that regard, charging controller 1011 may be configured to couple in any suitable manner to an electronic device that is to be coupled to UPS 1150. For example, in embodiments charging controller 1011 may electrically couple to power source 860 in an electronic device via one or more contacts (e.g., pins) within power connector 1003. Alternatively, UPS 1050 may include a charging controller connector 1012, as shown in FIGS. 10 and 11. When used, the charging controller connector 1012 may be configured to couple to a corresponding connector on an electronic device, e.g., when the electronic device is coupled to power connection 1003.

Alternatively or additionally, UPS 1050 may be configured to bypass power source 860, such that second electronic device 123 can operate on power provided by battery 1021 independent of power source 860. In such instances, UPS 1050 may also function as a battery eliminator for an electronic device coupled to UPS 1050. In such instances UPS may be configured and may function in a similar manner as battery eliminatory 850, except for its inclusion and use of batter 1021.

Like data connection 805, data connection 1005 is generally configured to communicatively couple an electronic device that is coupled to UPS 1050 (or a mount thereof) to another device that is inside or outside second compartment 107 or even outside system 700. Non-limiting examples of such other devices include those described above for data connection 805. In that regard, data connection 1005 may be configured to facilitate or enable communication between an electronic device coupled to mount 801 (e.g., second electronic device 123) and another device, e.g., via one or more currently known or future developed wired or wireless communications protocols. Without limitation, in embodiments data connection is configured to provide a physical data link between an electronic device (e.g., first or second electronic devices 117, 123) and another device. In embodiments data connection 1005 includes a physical data connector 1006 that is configured to mate with a second physical data connector on the electronic device (e.g., first or second electronic devices 117, 123), and which is configured to communicatively couple to another device as described above. Non-limiting examples of suitable physical data connectors that may be used as physical data connector 1006 include those described above in connection with data connector 806. Without limitation, in embodiments data connector 1006 is a male or female 50 pin connector.

In any case, data connector 1006 is configured such that is it compatible (i.e., can mate with) a corresponding device data connector on an electronic device that is to be coupled to UPS 1050. For example, when second electronic device 123 is a radio (such as a Manpack, HMS leader system, or handheld radio) with a first device data connector, data connector 1006 may be configured such that it can mate with the first device data connector to communicatively couple the second electronic device 123 to another device as described above. Data connector 1006 may be configured to mate with a device data connector of an electronic device when the electronic device is coupled to a mount 1101 of UPS 1050. In embodiments, second electronic device 123 is a Manpack or handheld radio that includes a device data connector, and data connector 1006 is configured to couple with the device data connector when the Manpack or handheld radio is coupled to mount 1101.

Alternatively or in addition to data connector 1006, data connection 1005 may optionally include a data pass through 1007. In general, data pass through 1007 is a conduit (e.g., through mount 1101) that is sized and configured to receive one or more data cables therethrough, e.g., for coupling to a data connector of an electronic device, such as second electronic device 123. Device pass through 1007 may be useful to accommodate current or future developed cabling, data connectors, etc. that are difficult to integrate into UPS 1050.

Like battery eliminator 850, UPS 1050 may optionally include one or more alignment elements, such as alignment element 1009. When used, such alignment elements may facilitate alignment and mating of power connector 1003 and data connection 1005 with corresponding device power and device data connectors on an electronic device that is to be coupled to UPS 1050 (or, more specifically, to mount 1101). The nature and configuration of alignment element 1009 is the same as alignment element 809 and thus is not described again in detail.

As noted above FIG. 11 depicts an example embodiment of a UPS 1050 that includes a mount 1101 and a base 1103, wherein the mount 1101 and base 1103 include the above noted elements. Similar to mount 801, mount 1101 may be configured to couple to a bottom or other side of an electronic device (e.g., a radio) that bears a device power and/or data connector. For example, and like mount 801, mount 1101 may include mounting recess defined at least in part by one or more walls 1115 and a bottom 1117, wherein the wall(s) 1115 is/are configured to snugly engage a portion of an electronic device, such as one or more sides thereof.

A side of the electronic device to be coupled to mount 1101 may include device alignment features that are formed in or extend from the same side of the device that bears the device power and device data connections. In such instances, alignment element 1009 may include one or more dock alignment features that correspond to the device alignment features. By aligning the device alignment features with the dock alignment features of alignment element 1009, power connector 1003, data connector 1005, and optional charging controller connector 1012 may be properly oriented and aligned with corresponding connectors on the electronic device, thereby allowing such connectors to properly couple with one another when the electronic device is brought into engagement with mount 1101. In instances where data connection 1005 includes a data pass through, data connection 1005 may be coupled to an optional second data connector 1123, which may be located on a side of base 1103, as shown in FIG. 11.

With reference again to FIG. 4B, the vehicle center console 400 includes first and second docking stations 701, 703, which may be configured as described above in connection with FIGS. 7-11. For the sake of illustration, FIG. 4B depicts an embodiment in which a power connector (and optionally a data connector) of first docking station 701 is coupled to a device power connector (and optionally a device data connector) of second electronic device 423 (in this case, a handheld radio), and a power connector of second docking station 703 is coupled to a device power connector (and optionally a device data connector) of third electronic device 430 (in this case, a Manpack radio). As can be seen, due to the configuration and low profile of docking stations 701, 703, the top of second and third electronic devices 423, 430 are positioned to not interfere with the closure of top cover 411 (e.g., a lid, not shown) of vehicle center console 1200. It is noted that the shape and configuration of docking stations 701, 703 in FIG. 4B are representative only.

While docking stations 701, 703 and their respective components are described herein in conjunction with their use with an adaptive cooling system and/or a vehicle center console, they are not limited to such uses or configurations. Indeed, docking stations 701, 703 may be used in a wide variety of applications and may be provisioned and used separately from the adaptive cooling systems and vehicle center console described herein.

According to one aspect of the disclosure, there is thus provided an adaptive cooling system. The adaptive cooling system may include a housing configured to be disposed in a vehicle and comprising at least one wall defining an interior and an exterior of the housing, a first compartment in the interior of the housing and a second compartment in the interior of the housing. The first compartment may be configured to house a first electronic device and the second compartment may be configured to house at least a second electronic device. The second electronic device may be separate from the first electronic device and electrically coupled to the first electronic device. The adaptive cooling system may also include a second electronic device cooling system configured to be disposed in the vehicle and including a second electronic device active cooling component and a second compartment inlet. The second compartment inlet may be coupled, e.g., mechanically and fluidly coupled, to the second compartment and the second electronic device active cooling component may be configured to provide air in the second compartment through the second compartment inlet for cooling the second electronic device. The adaptive cooling system may further include a controller configured to be disposed in the vehicle. The controller may be configured to: receive a first temperature sensor signal from a first temperature sensor disposed in the first compartment, the first temperature sensor signal being indicative of a first temperature of at least a component of the first electronic device, compare a signal representative of the first temperature to a first threshold (T1D1) for the first electronic device, and cause issuance of a first control signal when the signal representative of the first temperature is $\geq$T1D1, the first control signal configured to cause the second electronic device active cooling component to operate at a first duty level for cooling the second electronic device in the second compartment.

According to another aspect of the disclosure, there is provided a method for adaptive cooling in a vehicle, the method including, with a controller: receiving a first temperature sensor signal from a first temperature sensor disposed in a first compartment of a housing disposed in the vehicle, the first temperature sensor signal indicative of a first temperature of at least a component of a first electronic device disposed in the first compartment, the first electronic device being electrically coupled to a second electronic device disposed in a second compartment of the housing; and causing issuance of a first control signal when a signal representative of the first temperature is $\geq$a first temperature threshold (T1D1) for the first electronic device, wherein the first control signal is configured to cause a second electronic device active cooling component to operate at a first duty level for cooling the second electronic device in the second compartment.

According to another aspect of the disclosure, there is provided a system for storing least one electronic device. The system includes a housing configured to be disposed in a vehicle, the housing comprising at least one wall defining an interior and an exterior of the housing, a lid coupled to the at least one wall, and at least a first compartment in the interior of the housing, the first compartment configured to house a first electronic device; and a docking station for the first electronic device in the first compartment. The docking station includes: a mount configured to couple to the first electronic device; and a power connector that is configured to couple to a device power connector of the first electronic device when the first electronic device is coupled to the mount and to a power source external to the first electronic device. The first electronic device may be, for example, a handheld radio, a Manpack radio, or a handheld manpack small form fit (HMS) leader system. The docking station is configured to allow the lid to be in a closed position when the first electronic device is coupled to the mount.

It will be appreciated by those skilled in the art that any block diagrams herein represent conceptual views of systems embodying the principles of the disclosure. Similarly, it will be appreciated that any block diagrams, flow charts, flow diagrams, state transition diagrams, pseudocode, and the like represent various processes which may be substantially represented in computer readable medium and so executed by a computer or processor, whether or not such computer or processor is explicitly shown. Software modules, or simply modules which are implied to be software, may be represented herein as any combination of flowchart elements or other elements indicating performance of process steps and/or textual description. Such modules may be executed by hardware that is expressly or implicitly shown.

The term "coupled" as used herein in regard to electrical, electromagnetic or optical connections refers to any connection, coupling, link or the like by which signals carried by one system element are imparted to the "coupled" element. Such "coupled" devices, or signals and devices, are not necessarily directly connected to one another and may be separated by intermediate components or devices that may manipulate or modify such signals. Likewise, the terms "connected" or "coupled" as used herein in regard to mechanical or physical connections or couplings is a relative term and does not require a direct physical connection. Elements, components, modules, and/or parts thereof that are described and/or otherwise portrayed through the figures to communicate with, be associated with, and/or be based on, something else, may be understood to so communicate, be associated with, and/or be based on in a direct and/or indirect manner, unless otherwise stipulated herein.

Reference throughout this specification to "embodiments", "one embodiment", "an embodiment" or "some embodiments" means that a particular feature, structure, or characteristic described in connection with the embodiment is included in at least one embodiment. Thus, appearances of the phrases "in embodiments", "one embodiment", "an embodiment" or "some embodiments" in various places throughout this specification are not necessarily all referring to the same embodiment. Furthermore, the particular features, structures, or characteristics may be combined in any suitable manner in one or more embodiments.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

As used herein the term "about" when used in reference to a value or a range means+/−5% of the indicated value or range. Unless otherwise stated, use of the word "substantially" may be construed to include a precise relationship, condition, arrangement, orientation, and/or other characteristic, and deviations thereof as understood by one of ordinary skill in the art, to the extent that such deviations do not materially affect the disclosed methods and systems. Throughout the entirety of the present disclosure, use of the articles "a" and/or "an" and/or "the" to modify a noun may be understood to be used for convenience and to include one, or more than one, of the modified noun, unless otherwise specifically stated. The terms "comprising", "including" and "having" are intended to be inclusive and mean that there may be additional elements other than the listed elements.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

Although the methods and systems have been described relative to specific embodiments thereof, they are not so limited. Obviously, many modifications and variations may become apparent in light of the above teachings. Many additional changes in the details, materials, and arrangement of parts, herein described and illustrated, may be made by those skilled in the art.

What is claimed is:

1. An adaptive cooling system, comprising:
a housing configured to be disposed in a vehicle and comprising at least one wall defining an interior and an exterior of the housing, a first compartment in the interior of the housing and a second compartment in the interior of the housing, the first compartment configured to house a first electronic device, the second compartment configured to house at least a second electronic device, the second electronic device being separate from the first electronic device and electrically coupled to the first electronic device;
a second electronic device cooling system configured to be disposed in the vehicle and comprising a second electronic device active cooling component and a second compartment inlet, the second compartment inlet being coupled to the second compartment and the second electronic device active cooling component being configured to provide air in the second compartment through the second compartment inlet for cooling the second electronic device; and
a controller configured to be disposed in the vehicle, wherein the controller is configured to:
receive a first temperature sensor signal from a first temperature sensor disposed in the first compartment, the first temperature sensor signal being indicative a first temperature of at least a component of the first electronic device,
compare a signal representative of the first temperature to a first threshold (T1D1) for the first electronic device, and
cause issuance of a first control signal when the signal representative of the first temperature is ≥T1D1, the first control signal configured to cause the second electronic device active cooling component to operate at a first duty level for cooling the second electronic device in the second compartment.

2. The adaptive cooling system of claim 1, wherein the controller is further configured to:
compare the signal representative of the first temperature to a second threshold (T2D1) for the first electronic device; and
cause issuance of a second control signal when the first temperature is ≥T2D1, the second control signal configured to cause the second electronic device active cooling component to operate at a second duty level that is higher than the first duty level for cooling the second electronic device in the second compartment.

3. The adaptive cooling system of claim 1, further comprising the first temperature sensor, wherein the first temperature sensor is an integral temperature sensor that is integral with the first electronic device.

4. The adaptive cooling system of claim 1, wherein the controller is further configured to:
receive a second temperature sensor signal from a second temperature sensor disposed in the second compartment, the second temperature sensor signal being indicative of an ambient temperature in the second compartment;
compare a signal representative of the ambient temperature to a first temperature threshold (T1D2) for the second electronic device; and
cause issuance of the first control signal when the signal representative of the first temperature is <T1D1 and the signal representative of the ambient temperature is ≥T1D2.

5. The adaptive cooling system of claim 4, further comprising the first temperature sensor and the second temperature sensor, wherein the first temperature sensor is an integral temperature sensor that is integral with the first electronic device.

6. The adaptive cooling system of claim 1, further comprising a lid coupled to the at least one wall, the lid being movable between a closed position wherein the lid is positioned to block access to the first and second compartments and an open position wherein the access to the first and second compartments is not blocked by the lid.

7. The adaptive cooling system of claim 1, further comprising:
a first electronic device cooling system separate from the second electronic device cooling system, the first electronic device cooling system comprising a first electronic device active cooling component and a first compartment inlet, the first compartment inlet being coupled to the first compartment and the first electronic device active cooling component being configured to provide air in the first compartment through the first compartment inlet for cooling the first electronic device.

8. The adaptive cooling system of claim 1, further comprising a first docking station in the first compartment, wherein:
the first docking station comprises a mount that is configured to couple to the first electronic device; and
the first docking station comprises a power connector that is configured to couple to a device power connector of the first electronic device when the first electronic device is coupled to the mount, and to a power source external to the first electronic device.

9. The adaptive cooling system of claim 8, wherein the first docking station comprises a battery eliminator.

10. The adaptive cooling system of claim 8, wherein the first docking station comprises an uninterruptible power supply (UPS).

11. The adaptive cooling system of claim 8, wherein the first docking station comprises a data connection that is separate from the power connector and is configured to communicatively couple with the first electronic device when the first electronic device is coupled to the mount.

12. The adaptive cooling system of claim 8, further comprising an alignment element, wherein the alignment element is configured to align with a device alignment feature of the first electronic device when the first electronic device is coupled to the mount.

13. The adaptive cooling system of claim 12, wherein the alignment element comprises a pin that extends from a surface of the mount.

14. The adaptive cooling system of claim 8, wherein the mount comprises at least one wall and a bottom, wherein the at least one wall and the bottom at least partially define a mounting recess that is configured to receive at least a portion of the first electronic device.

15. A method for adaptive cooling in a vehicle, the method comprising, with a controller:
receiving a first temperature sensor signal from a first temperature sensor disposed in a first compartment of a housing disposed in the vehicle, the first temperature sensor signal indicative of a first temperature of at least a component of a first electronic device disposed in the first compartment, the first electronic device being electrically coupled to a second electronic device disposed in a second compartment of the housing; and
causing issuance of a first control signal when a signal representative of the first temperature is ≥a first temperature threshold (T1D1) for the first electronic device, wherein the first control signal is configured to cause a second electronic device active cooling component to operate at a first duty level for cooling the second electronic device in the second compartment.

16. The method of claim 15, further comprising, with the controller:
causing issuance of a second control signal when the signal representative of the first temperature is ≥a second temperature threshold (T2D1) for the first electronic device, the second control signal being configured to cause the second electronic device active cooling component to operate at a second duty level that is higher than the first duty level.

17. The method of claim 15, further comprising, with the controller:
receiving a second temperature sensor signal from a second temperature sensor disposed in the second compartment, the second temperature sensor signal being indicative of an ambient temperature in the second compartment; and
cause issuance of the first control signal when the signal representative of the first temperature is <T1D1 and a signal representative of the ambient temperature is ≥a first temperature threshold (T1D2) for the second electronic device.

18. The method of claim 15, wherein the first temperature sensor is an integral temperature sensor that is integral with the first electronic device.

19. The method of claim 15, further comprising:
operating a first electronic device cooling system for cooling the first electronic device in the first compartment, the first electronic device cooling system being separate from the second electronic device cooling system.

* * * * *